(12) United States Patent
Lee et al.

(10) Patent No.: US 9,356,031 B2
(45) Date of Patent: May 31, 2016

(54) THREE DIMENSIONAL NAND STRING MEMORY DEVICES WITH VOIDS ENCLOSED BETWEEN CONTROL GATE ELECTRODES

(71) Applicant: SanDisk Technologies Inc., Plano, TX (US)

(72) Inventors: Yao-Sheng Lee, Tampa, FL (US); Jayavel Pachamuthu, San Jose, CA (US); Raghuveer S. Makala, Campbell, CA (US); George Matamis, Danville, CA (US); Johann Alsmeier, San Jose, CA (US); Henry Chien, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/456,496

(22) Filed: Aug. 11, 2014

(65) Prior Publication Data

US 2016/0043093 A1 Feb. 11, 2016

(51) Int. Cl.
*H01L 27/115* (2006.01)
*H01L 29/66* (2006.01)
(Continued)

(52) U.S. Cl.
CPC .... *H01L 27/11521* (2013.01); *H01L 21/28273* (2013.01); *H01L 21/28282* (2013.01); *H01L 21/764* (2013.01); *H01L 27/11556* (2013.01); *H01L 27/11568* (2013.01); *H01L 27/11582* (2013.01); *H01L 29/0649* (2013.01); *H01L 29/1033* (2013.01); *H01L 29/4234* (2013.01); *H01L 29/42324* (2013.01); *H01L 29/513* (2013.01); *H01L 29/66825* (2013.01); *H01L29/66833* (2013.01); *H01L 29/788* (2013.01); *H01L 29/792* (2013.01)

(58) Field of Classification Search
None
See application file for complete search history.

(56) References Cited

U.S. PATENT DOCUMENTS 5,084,417 A  1/1992  Joshi et al.
5,807,788 A  9/1998  Brodsky et al.
(Continued)

FOREIGN PATENT DOCUMENTS

WO  WO02/15277 A2  2/2002

OTHER PUBLICATIONS

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

(Continued)

*Primary Examiner* — Marc Armand
*Assistant Examiner* — Younes Boulghassoul
(74) *Attorney, Agent, or Firm* — The Marbury Law Group PLLC

(57) ABSTRACT

A method of making a monolithic three dimensional NAND string includes forming a stack of alternating first and second material layers over a substrate, etching the stack to form a front side opening, partially removing the second material layers through the front side opening to form front side recesses, forming a first blocking dielectric in the front side recesses, forming charge storage regions over the first blocking dielectric in the front side recesses, forming a tunnel dielectric layer and a semiconductor channel over the charge storage regions in the front side opening, etching the stack to form a back side opening, removing the second material layers through the back side opening to form back side recesses using the first blocking dielectric as an etch stop, forming a second blocking dielectric in the back side recesses, and forming control gates over the second blocking dielectric in the back side recesses.

4 Claims, 16 Drawing Sheets

(51) Int. Cl.
*H01L 29/788* (2006.01)
*H01L 21/764* (2006.01)
*H01L 29/06* (2006.01)
*H01L 29/51* (2006.01)
*H01L 29/423* (2006.01)
*H01L 21/28* (2006.01)
*H01L 29/10* (2006.01)
*H01L 29/792* (2006.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,912,591 | B2 * | 12/2014 | Baek ............... H01L 27/11568 257/324 |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001264 | A1 | 1/2012 | Kim et al. |
| 2012/0012920 | A1 * | 1/2012 | Shin ............... H01L 27/11578 257/324 |
| 2012/0092926 | A1 | 4/2012 | Whang et al. |
| 2012/0256247 | A1 * | 10/2012 | Alsmeier ............ H01L 21/764 257/319 |
| 2012/0326221 | A1 | 12/2012 | Sinha |
| 2013/0248974 | A1 | 9/2013 | Alsmeier et al. |
| 2013/0264631 | A1 * | 10/2013 | Alsmeier .......... H01L 21/28282 257/324 |
| 2013/0313627 | A1 | 11/2013 | Lee et al. |
| 2013/0334589 | A1 | 12/2013 | Ahn |
| 2014/0008714 | A1 * | 1/2014 | Makala ............ H01L 21/28273 257/324 |
| 2014/0160841 | A1 * | 6/2014 | Koval ................ H01L 29/7827 365/185.01 |
| 2014/0225181 | A1 | 8/2014 | Makala et al. |

OTHER PUBLICATIONS

Y.S. Kim et al., "Direct Copper Electroless Deposition on a Tungsten Barrier Layer for Ultralarge Scale Integration," Abstract of; Journal of the Electrochemical Society, vol. 152 (2) 2005.

Y. Au et al., "Filling Narrow Trenches by Iodine-Catalyzed CVD of Copper and Manganese on Manganese Nitride Barrier/Adhesion Layers," Abstract of; Journal of the Electrochemical Society vol. 158 (5) 2011.

K. R. Williams et al., "Etch Rates for Micromachining Processing," Journal of Microelectromechanical Systems, vol. 5, No. 4, Dec. 1996.

K. R. Williams et al., " Etch Rates for Micromachining Processing Part II," Journal of Microelectromechanical Systems, vol. 12, No. 6, Dec. 2003.

M. Claes et al., "Selective Wet Etching of Hf-based Layers," Abstracts, 204th Meeting of the Electrochemical Society, 2003.

U.S. Appl. No. 14/133,979, filed Dec. 19, 2013, SanDisk Technologies Inc.

U.S. Appl. No. 14/183,152, filed Feb. 18, 2014, SanDisk Technologies Inc.

U.S. Appl. No. 14/219,161, filed Mar. 19, 2014, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/264,262, filed Apr. 29, 2014, SanDisk Technologies Inc.

U.S. Appl. No. 14/264,312, filed Apr. 29, 2014, SanDisk Technologies Inc.

U.S. Appl. No. 14/264,407, filed Apr. 29, 2014, SanDisk Technologies Inc.

U.S. Appl. No. 14/282,567, filed May 20, 2014, SanDisk Technologies Inc.

U.S. Appl. No. 14/319,283, filed Jun. 30, 2014, SanDisk Technologies Inc.

U.S. Appl. No. 14/456,515, filed Aug. 11, 2014, SanDisk Technologies Inc.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.ip/english/NEWS_EN/20090619/171977/ Nikkei Microdevices, Tech-On, Jun. 19, 2009.

International Searching Authority for PCT/US2015/043072, filed Jul. 31, 2015, Invitation to Pay Additional Fees, mailed Oct. 16, 2015, (9 pages).

International Search Report and Written Opinion, International Application No. PCT/US2015/043072, issued Jan. 20, 2016, 27pgs.

* cited by examiner

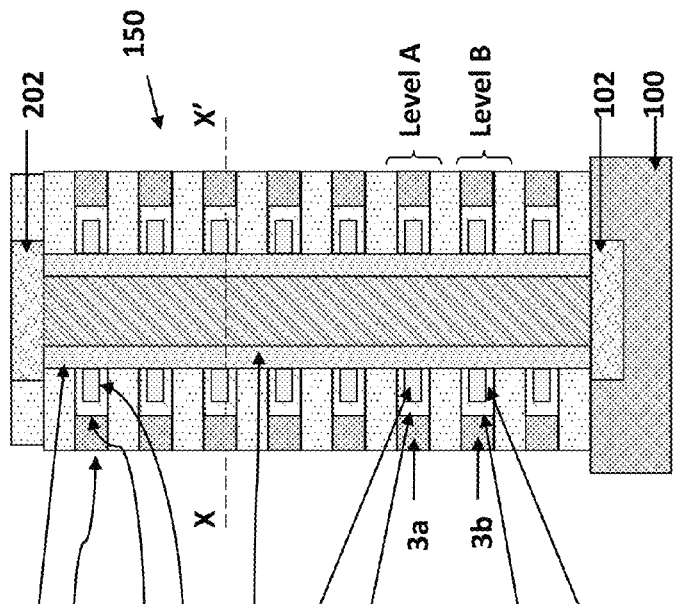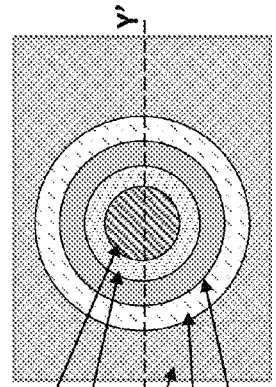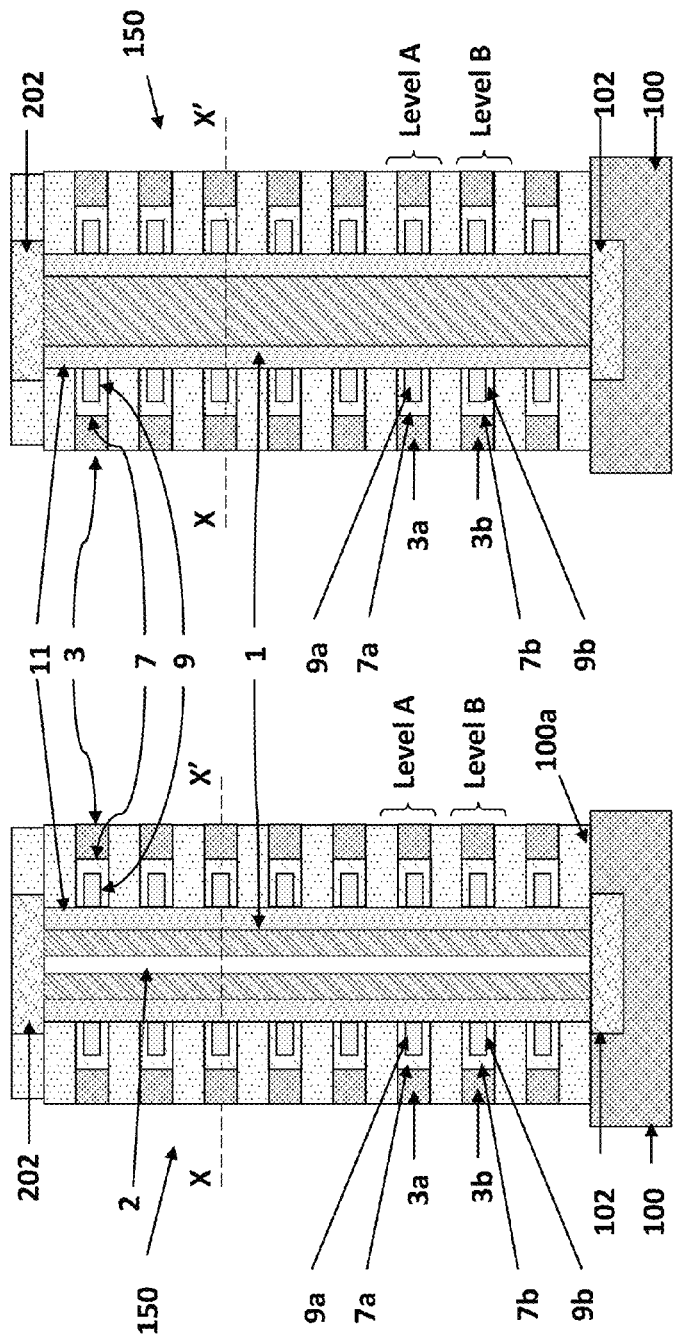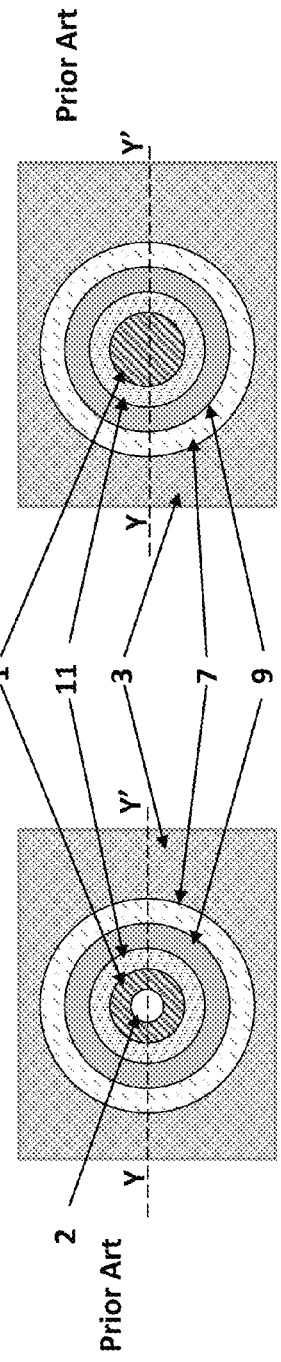

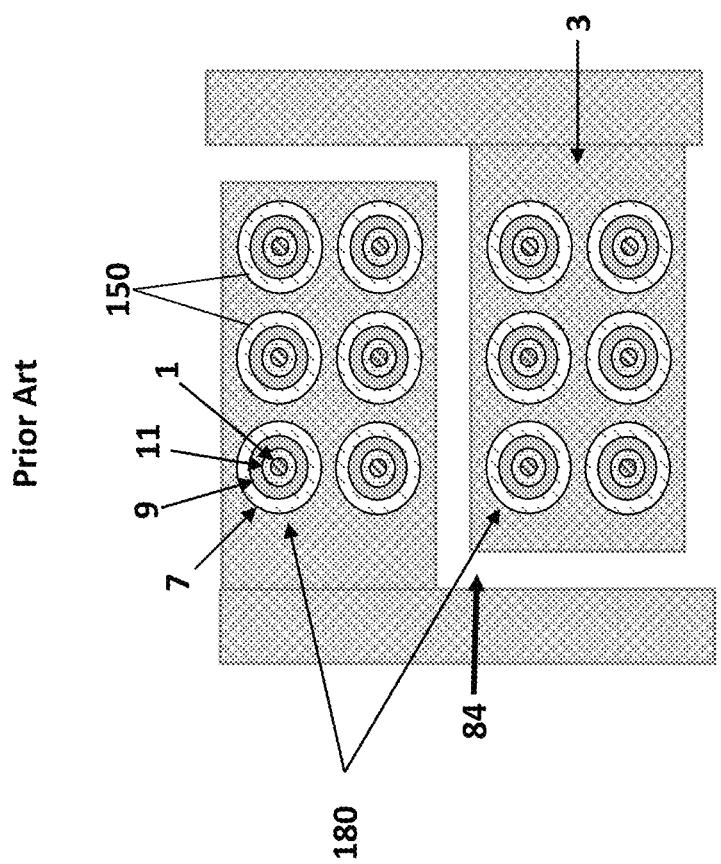

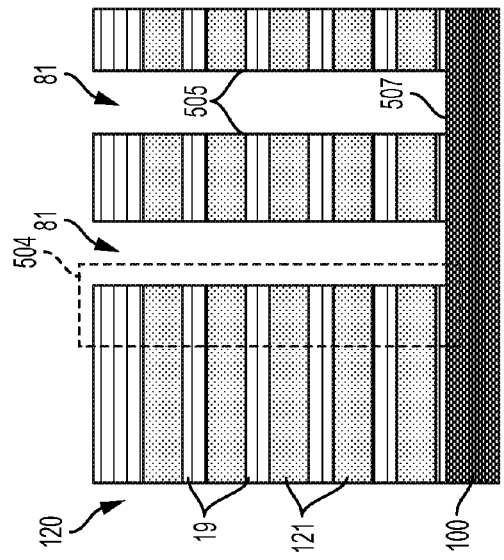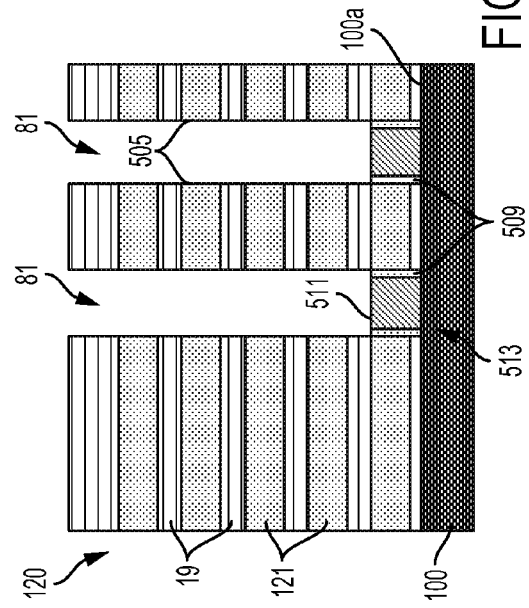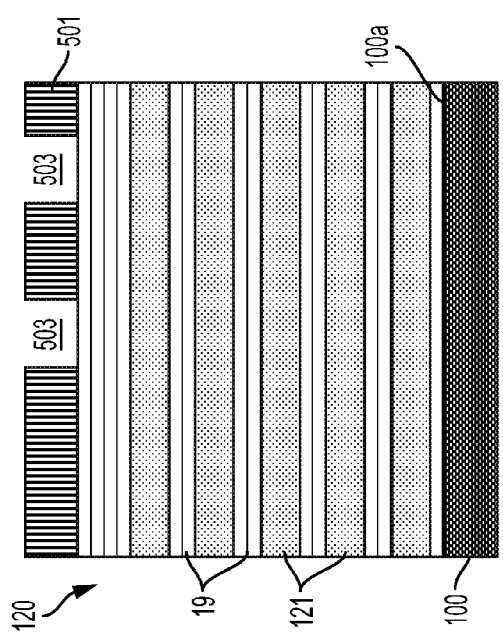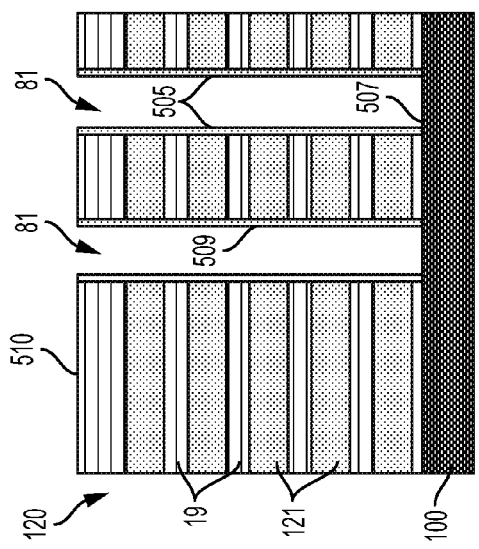
FIG. 5A
FIG. 5B
FIG. 5C
FIG. 5D

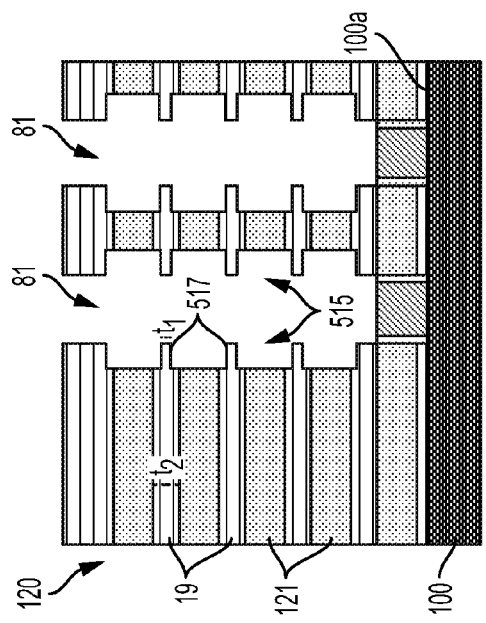
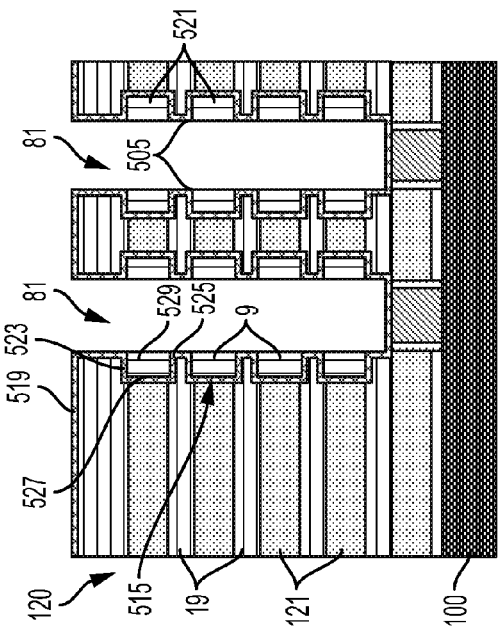
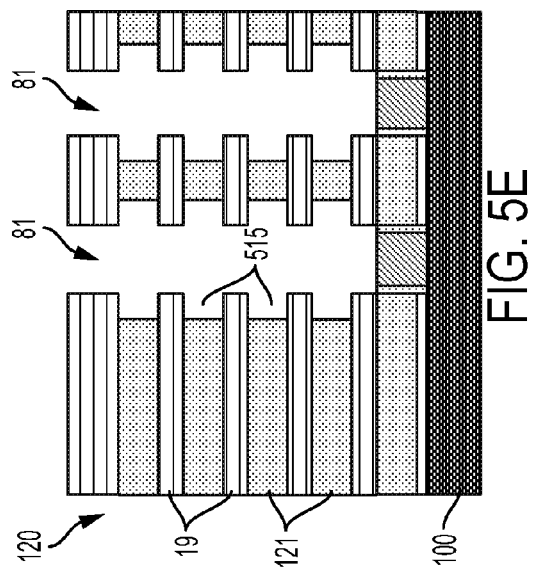
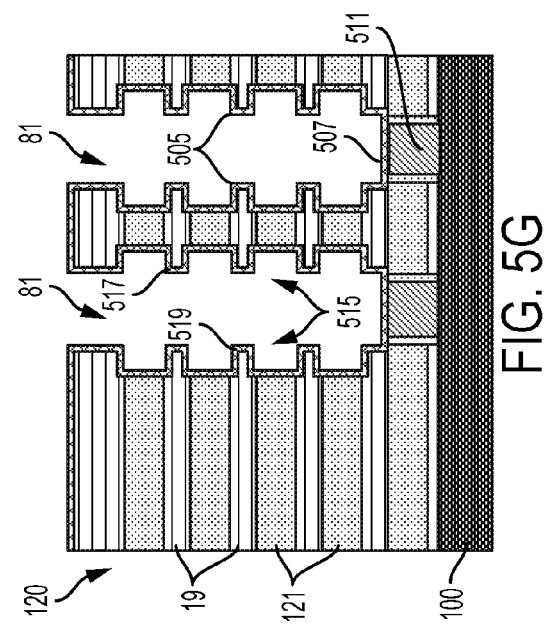

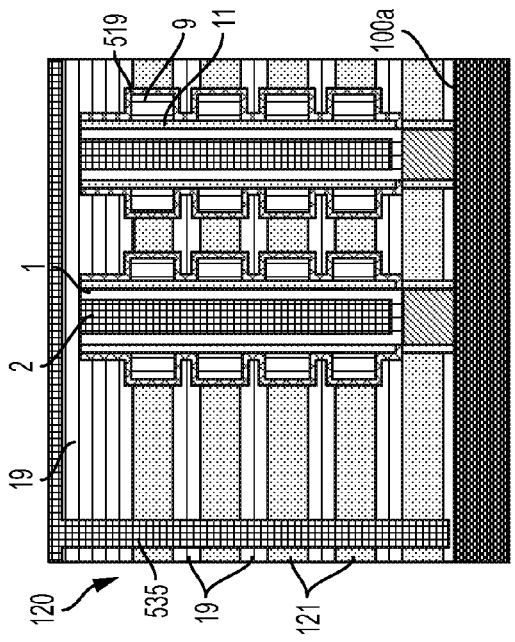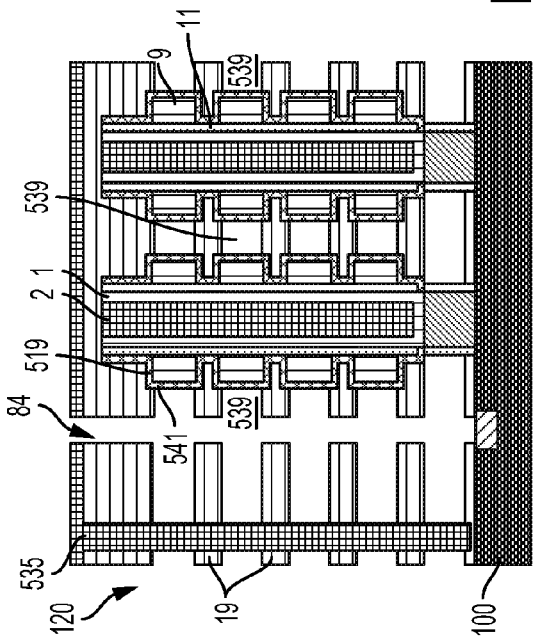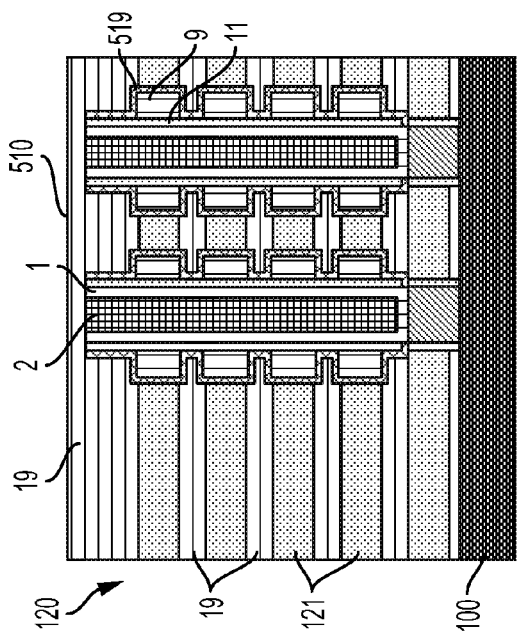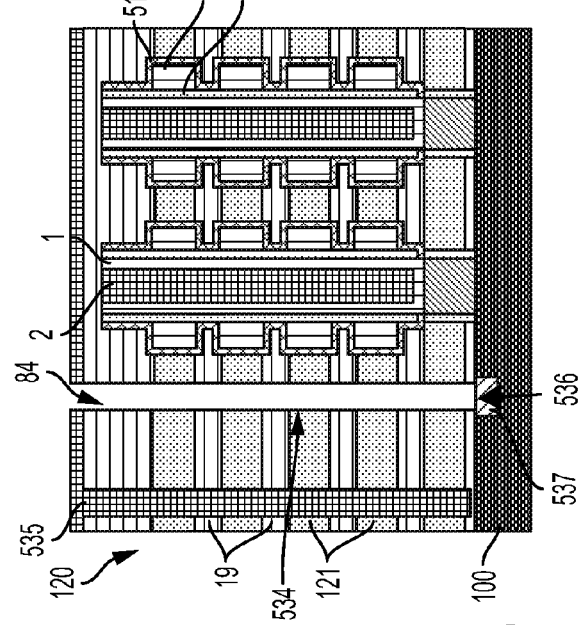

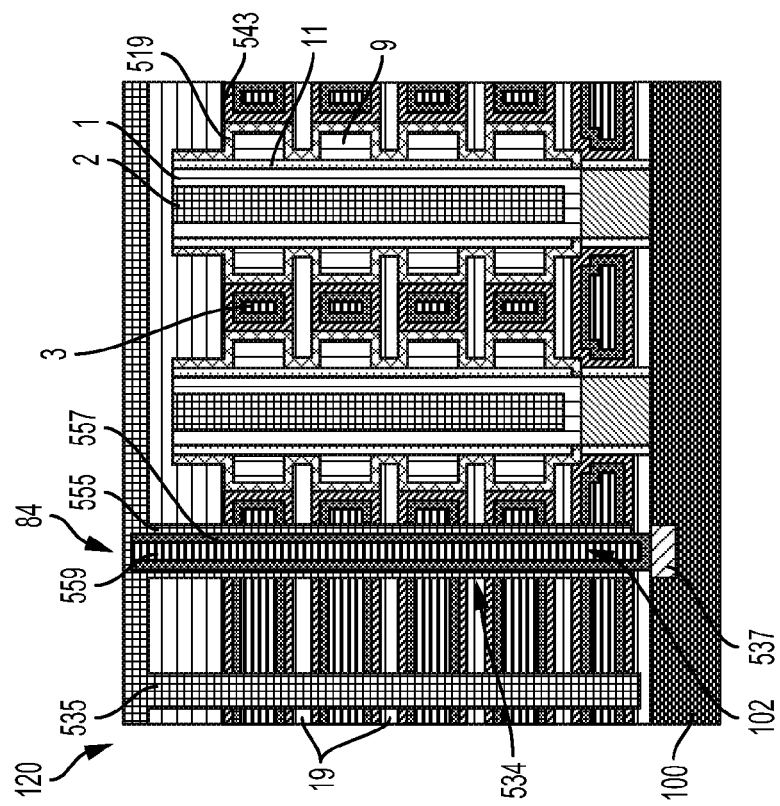
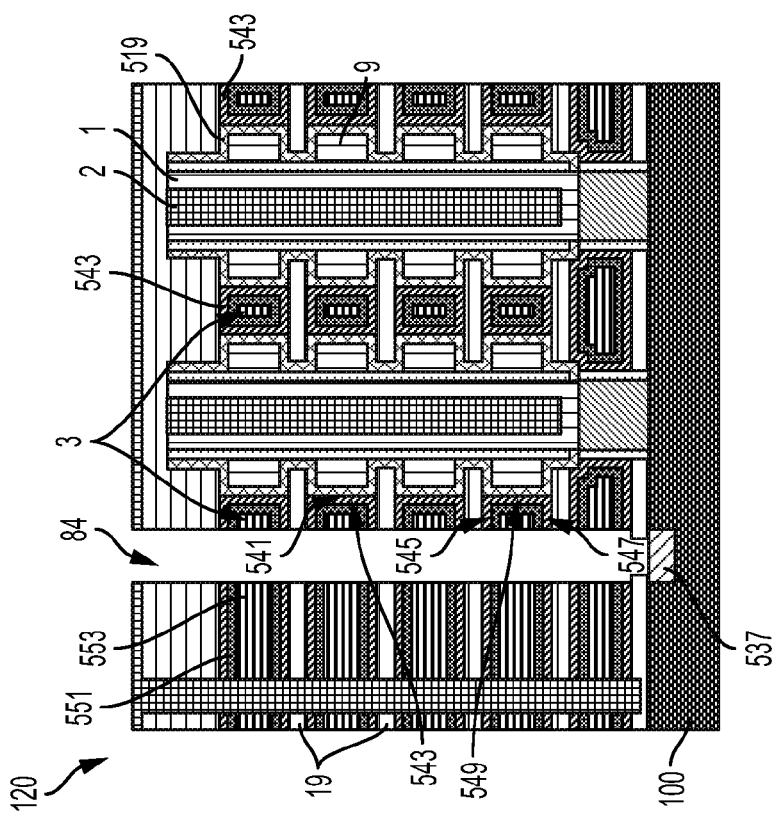
FIG. 5R
FIG. 5Q

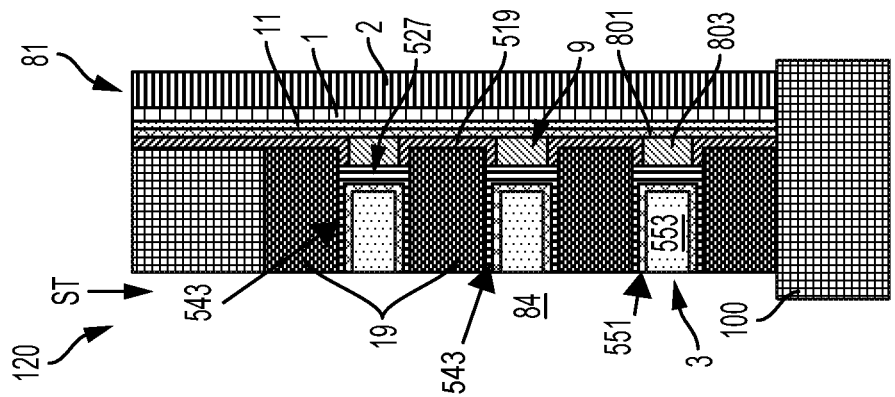
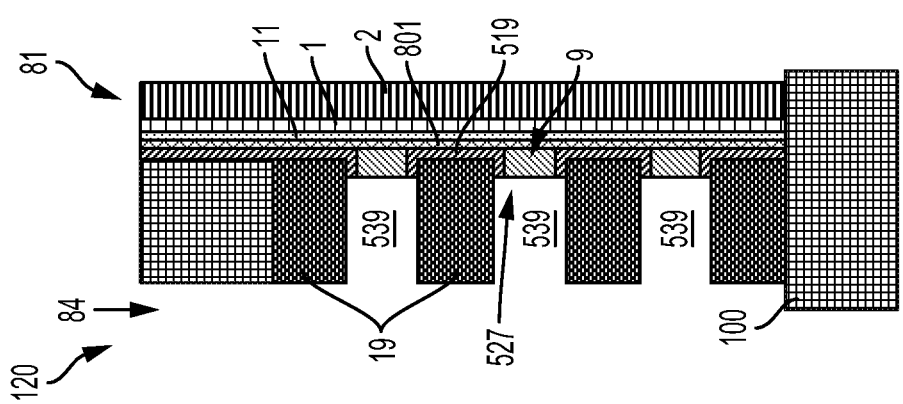
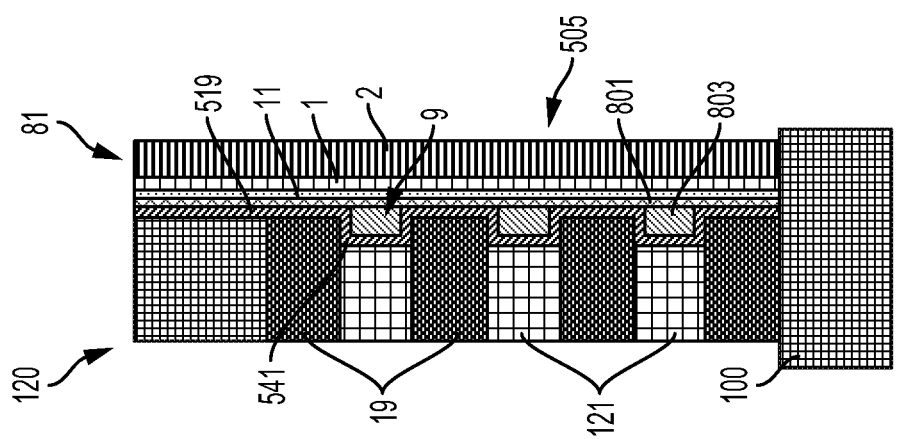

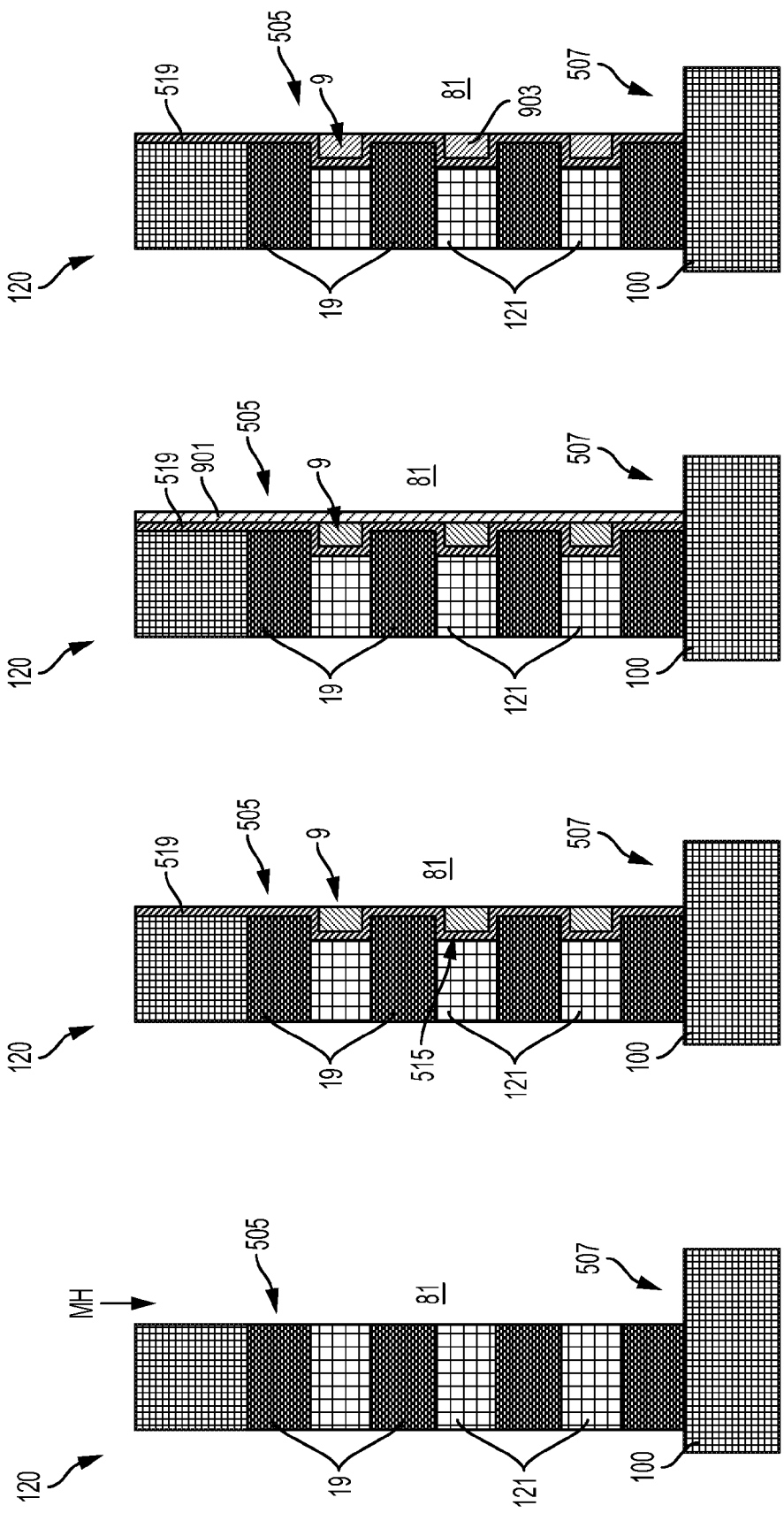

THREE DIMENSIONAL NAND STRING MEMORY DEVICES WITH VOIDS ENCLOSED BETWEEN CONTROL GATE ELECTRODES

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string including forming a stack of alternating layers of a first material and a second material different than the first material over a substrate, etching the stack to form a front side opening in the stack, removing a first portion of the second material layers through the front side opening to form front side recesses between the first material layers, forming a first blocking dielectric in the front side recesses through the front side opening, forming charge storage regions over the first blocking dielectric in the front side recesses through the front side opening, forming a tunnel dielectric layer over the charge storage regions in the front side opening, forming a semiconductor channel layer over the tunnel dielectric layer in the front side opening, etching the stack to form a back side opening in the stack, removing by etching at least a second portion of the second material layers through the back side opening to form back side recesses between the first material layers using the first blocking dielectric as an etch stop such that first portions of the first blocking dielectric are exposed in the back side recesses, forming a second blocking dielectric in the back side recesses through the back side opening, and forming control gates over the second blocking dielectric in the back side recesses through the back side opening.

Another embodiment relates to a monolithic three-dimensional NAND string that includes a semiconductor channel, where at least one end portion of the semiconductor channel extends substantially perpendicular to a major surface of a substrate. A plurality of control gate electrodes extend substantially parallel to the major surface of the substrate, where each control gate electrode includes a top surface, a bottom surface opposite the top surface, and a first side surface facing the at least one end portion of the semiconductor channel. The plurality of control gate electrodes include at least a first control gate electrode located in a first device level and a second control gate electrode located in a second device level located over the major surface of the substrate and below the first device level. A plurality of vertically spaced apart charge storage regions each include a top surface, a bottom surface opposite the top surface, a first side surface facing a control gate electrode and a second side surface facing the at least one end potion of the semiconductor channel. The plurality of vertically spaced apart charge storage regions include at least a first spaced apart charge storage region located in the first device level and a second spaced apart charge storage region located in the second device level. A blocking dielectric surrounds each of the charge storage regions over the top, bottom and first side surfaces of the charge storage regions and surrounds each of the control gate electrodes over the top, bottom and first side surfaces of the control gate electrodes. A tunnel dielectric is located between each one of the plurality of the vertically spaced apart charge storage regions and the semiconductor channel.

Another embodiment relates to a method of making a monolithic three dimensional NAND string including forming a stack of alternating layers of a first material and a second material different than the first material over a substrate, etching the stack to form a front side opening in the stack, forming at least one charge storage region in the front side opening, forming a tunnel dielectric layer over the at least one charge storage region in the front side opening, forming a semiconductor channel layer over the tunnel dielectric layer in the front side opening, etching the stack to form a back side opening in the stack, removing by etching at least a second portion of the second material layers through the back side opening to form back side recesses between the first material layers, forming control gates in the back side recesses through the back side opening, where the control gates are separated from the at least one charge storage region by at least one blocking dielectric, and removing by etching at least a first portion of the first material layers through the back side opening to form air gaps between the control gates.

Another embodiment relates to a monolithic three-dimensional NAND string that includes a semiconductor channel, where at least one end portion of the semiconductor channel extends substantially perpendicular to a major surface of a substrate. A plurality of control gate electrodes extend substantially parallel to the major surface of the substrate, where the plurality of control gate electrodes includes at least a first control gate electrode located in a first device level and a second control gate electrode located in a second device level located over the major surface of the substrate and below the first device level. A blocking dielectric is located in contact with the plurality of control gate electrodes. A plurality of air gaps are between the respective device levels, where each of the plurality of air gaps has a substantially rectangular-shaped cross-section in a plane extending perpendicular to a major surface of the substrate, and each air gap includes a void region enclosed on three sides by the blocking dielectric. The monolithic three-dimensional NAND string also includes at least one charge storage region and a tunnel dielectric located between the at least one charge storage region and the semiconductor channel.

Another embodiment relates to a method of making a monolithic three dimensional NAND string that includes forming a stack of alternating layers of a first material and a second material different than the first material over a substrate, etching the stack to form a front side opening in the stack, removing a first portion of the second material layers through the front side opening to form front side recesses between the first material layers, forming a blocking dielectric in the front side recesses through the front side opening, forming charge storage regions over the blocking dielectric in the front side recesses through the front side opening, forming a tunnel dielectric layer over the charge storage regions in the front side opening, forming a semiconductor channel layer over the tunnel dielectric layer in the front side opening, etching the stack to form a back side opening in the stack, removing by etching at least a second portion of the second material layers through the back side opening to form back side recesses between the first material layers using the blocking dielectric as an etch stop such that first portions of the blocking dielectric are exposed in the back side recesses, forming a layer of a doped semiconductor material in the back side recesses through the back side opening, and forming an electrically conductive material over the layer of doped semiconductor material to form control gates in the back side recesses through the back side opening.

Another embodiment relates to a monolithic three-dimensional NAND string that includes a semiconductor channel, where at least one end portion of the semiconductor channel extends substantially perpendicular to a major surface of a substrate. A plurality of control gate electrodes extend substantially parallel to the major surface of the substrate, where each control gate electrode comprises an electrically conductive material and a layer of doped semiconductor material extending over a top surface, a bottom surface opposite the top surface and a first side surface of the electrically conductive material facing the at least one end portion of the semiconductor channel. The plurality of control gate electrodes include at least a first control gate electrode located in a first device level and a second control gate electrode located in a second device level located over the major surface of the substrate and below the first device level. A plurality of vertically spaced apart charge storage regions each include a top surface, a bottom surface opposite the top surface, a first side surface facing a control gate electrode and a second side surface facing the at least one end potion of the semiconductor channel. The plurality of vertically spaced apart charge storage regions include at least a first spaced apart charge storage region located in the first device level and a second spaced apart charge storage region located in the second device level. A blocking dielectric surrounds each of the charge storage regions over the top, bottom and first side surfaces of the charge storage regions and is located between the first side surfaces of the charge storage regions and the first side surfaces of the control gate electrodes in each of the device levels. A tunnel dielectric is located between each one of the plurality of vertically spaced apart charge storage regions and the semiconductor channel.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 4 is a top schematic view of a portion of a conventional memory device comprising NAND strings.

FIGS. 8A-8F illustrate a method of making a NAND string according to yet another embodiment.

FIGS. 9A-9G illustrate a method of making a NAND string according to yet another embodiment.

DETAILED DESCRIPTION

Various embodiments relate to monolithic three-dimensional NAND memory strings and methods of fabricating a monolithic three-dimensional NAND memory string. In one embodiment, a first blocking dielectric is formed in front side recesses in a front side opening and a second blocking dielectric is formed in back side recesses in a back side opening. In another embodiment, air gaps are formed between control gate electrodes through the back side opening.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
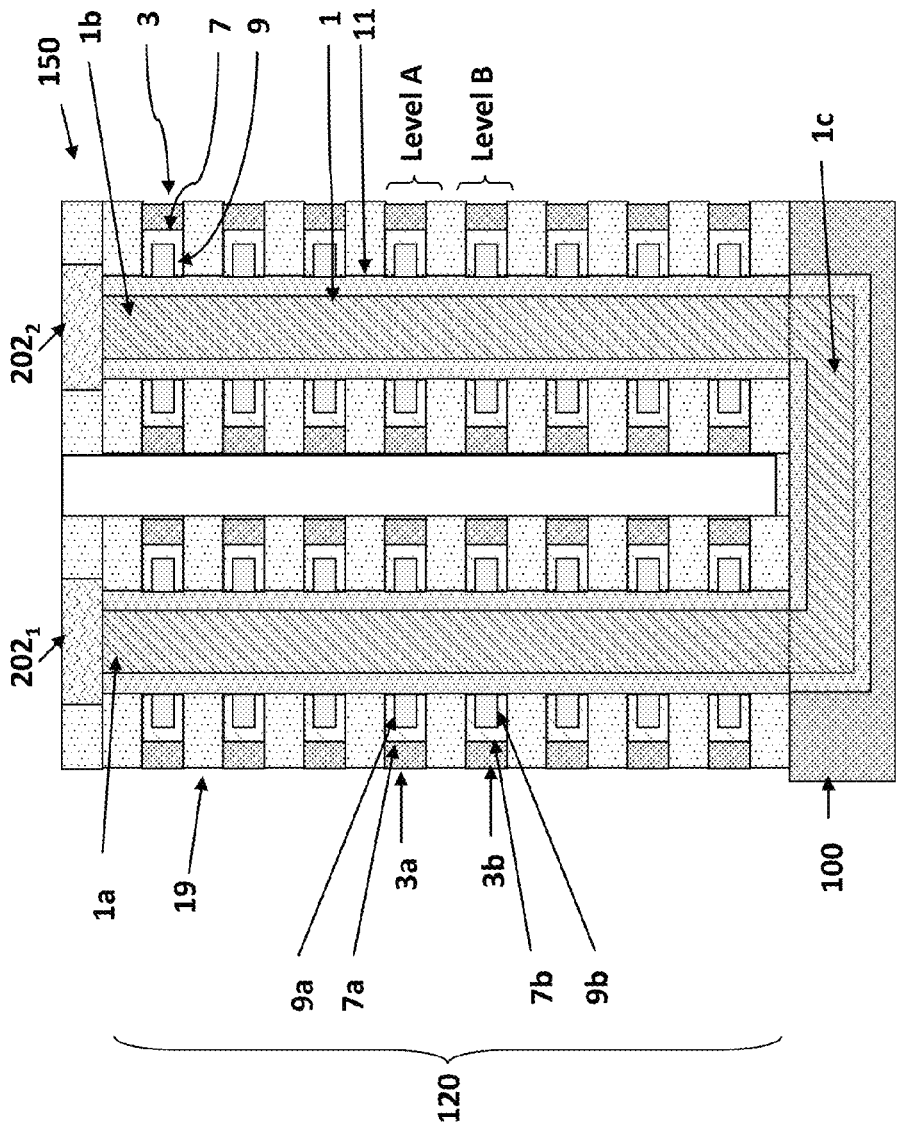
FIG. 3A is a side cross sectional view of a conventional NAND string of an embodiment with a U-shaped channel.
Figure 3B:
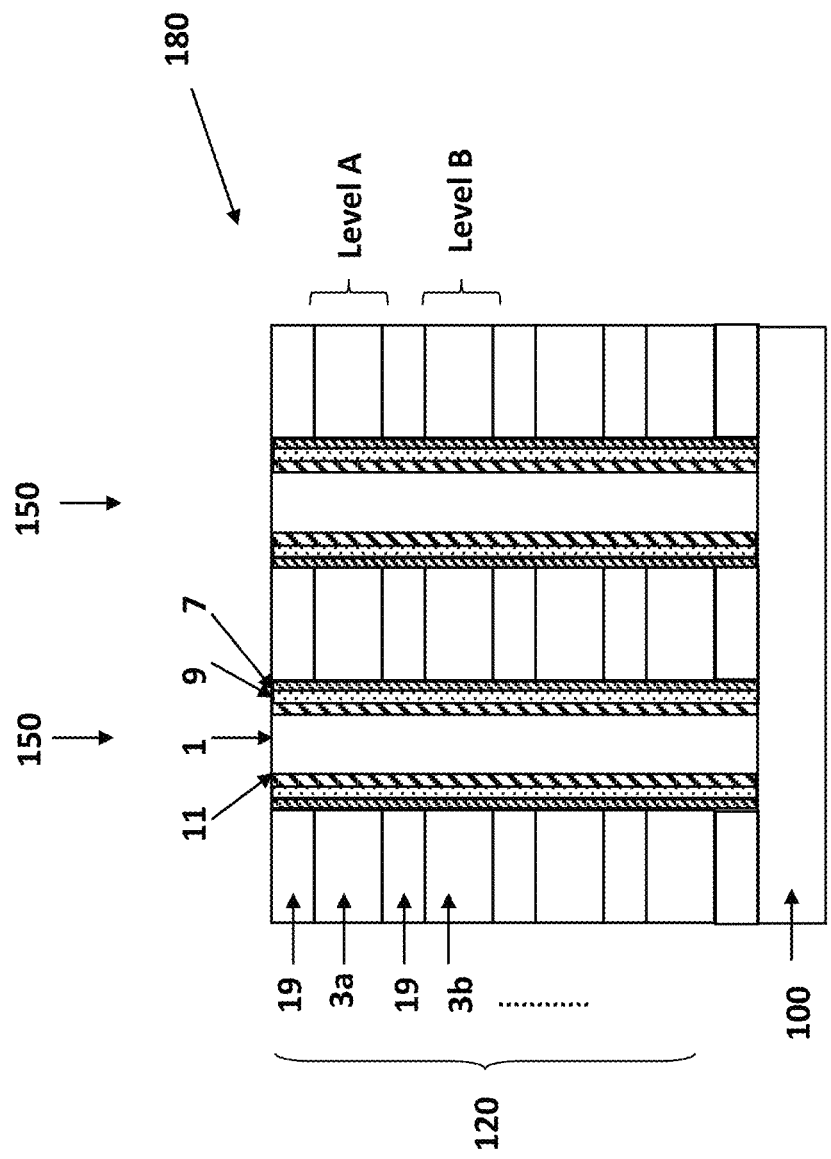
FIG. 3B is a side cross sectional view of another conventional NAND string.

In some embodiments, the monolithic three dimensional NAND string 150 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 2A and 3B. The channels 1 may be electrically connected to first and second (e.g., source and drain) electrodes 102, 202 which are schematically shown in FIGS. 1A and 2A. The first (e.g., source) electrode 102 may connect to the bottom of the channel 1 and the second (e.g., drain electrode 202) may connect to the top of the channel 1. The NAND string 150 may further include drain-side and source-side select or access transistors (not shown in FIGS. 1A, 2A and 3B for clarity) which may be located above and below the memory levels of the NAND string 150, respectively.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string 150 in this embodiment may further include drain-side and source-side select or access transistors (not shown in FIG. 3A for clarity), both of which may be located above the memory levels of the NAND string 150 and electrically connected to the respective wing portions 1a and 1b of the semiconductor channel 1.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

A memory array 180 may comprise a plurality of NAND strings 150 formed in a stack 120 of material layers over the substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B electrically separated from each other by a plurality of electrically insulating layers 19 forming a stack 120 of alternating control gate electrodes 3 and insulating layers 19. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof or combination of these materials. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate 3, as shown in FIGS. 1A, 2A and 3A. Alternatively, a straight blocking dielectric layer 7 may be located only adjacent to an edge (i.e., minor surface) of each control gate 3, as shown in FIG. 3B. The blocking dielectric 7 may comprise one or more layers having a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprises a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions or segments 9 located between the blocking dielectric and the channel 1, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal particles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

FIG. 4 is a top schematic view illustrating a portion of a conventional memory device comprising one or more arrays 180 of NAND strings 150 having channels 1 located in respective memory holes 81 (e.g., front side openings). In this device, the memory holes 81 are circular, thereby resulting in cylindrical pillar shaped NAND strings 150. From the top view, the tunnel dielectric 11, charge storage region 9 and blocking dielectric 7 form concentric rings around the channel 1. The control gate 3 in each device level is generally slab shaped. A back side opening 84, such as a trench, electrically separates adjacent control gates 3 and arrays 180 (e.g., memory blocks) of NAND strings 150 from each other. As discussed in more detail below, the back side opening 84 may be used in the manufacture of NAND strings 150 according to some embodiments.

A first embodiment method of making a NAND string 150 is illustrated in FIGS. 5A-5R. In some embodiments, the methods described herein may be used to make a NAND string 150 having improved performance and scalability with respect to conventional devices, including an improved control gate 3 to charge storage region 9 coupling ratio. In this embodiment, a first blocking dielectric is formed in front side recesses in a front side opening and a second blocking dielectric is formed in back side recesses in a back side opening.

As illustrated in FIG. 5A, the method includes forming a stack 120 of alternating first material layers 19 and second material layers 121 over a major surface 100a of substrate 100. The second material is different from the first material. The layers 19, 121 may be formed by a suitable deposition method, such as sputtering, CVD, PECVD, MBE, ALD, etc. The layers 19, 121 may be 6 to 100 nm thick.

In one embodiment, the first material layers 19 comprise an electrically insulating material, such as an oxide (e.g., silicon oxide, silicon oxynitride, a high-k dielectric, etc.). The second material layers 121 may comprise a sacrificial material, such as an insulating material that is different from the material of the first layers 19. For example, layers 19 may comprise silicon oxide (e.g., formed using a tetraethyl orthosilicate (TEOS) source) and layers 121 may comprise silicon nitride forming an ONON stack 120. Alternatively, layers 19 may comprise silicon oxide and layers 121 may comprise polysilicon forming an OPOP stack 120.

The formation of layers 19, 121 may be followed by etching the stack 120 to form at least one front side opening 81 in the stack 120. An array of front side openings 81 (e.g., cylindrical memory openings of holes) may be formed in locations where vertical channels of NAND strings 150 will be subsequently formed.

The front side openings 81 may be formed by photolithography and etching as follows. First, a memory hole mask 501 may be formed over the stack 120 and patterned to form openings 503 exposing the stack 120 as shown in FIG. 5A. The mask 501 may comprise any suitable material, such as one or more layer of photoresist and/or hard mask material. Then, the stack 120 may be etched (e.g., using reactive ion etching (RIE)) to form the openings 81 in the stack through the openings 503 in the mask 501 as shown in FIG. 5B. In the embodiment of FIG. 5B, the etching may be stopped at the substrate 100. Alternatively, an etch stop layer may be formed over the substrate and the etching may be stopped on the etch stop layer. Following the etching to form the front side memory openings 81, the mask 501 may be removed. Region 504 shows in dashed lines will be described below in reference to FIG. 7A.

Each of the front side memory openings 81 may include a sidewall 505 defined by the exposed surfaces of the layers 19, 121 of the stack 120 and a bottom surface 507, which in this embodiment is defined by the exposed surface of the substrate 100.

Next, an insulating layer 509, such as an oxide layer (e.g., silicon oxide) may be formed over the stack 120 including over the sidewalls 505 and bottom surfaces 507 of each of the front side openings 81. An anisotropic etching process (e.g., an RIE process) may then be performed to remove the insulating layer 509 from the top surface 510 of the stack 120 and from the bottom surface 507 of each of the front side openings 81 to expose the semiconductor substrate 100, while the insulating layer 509 may remain over the sidewalls 505 of the front side openings 81, as shown in FIG. 5C.

A protrusion 511 comprising a semiconductor material may optionally be formed over the bottom surface 507 of each front side opening 81 and in contact with the surface 100a of the semiconductor substrate 100, as shown in FIG. 5D. In embodiments, an epitaxial single crystal semiconductor layer, such as a single crystal silicon layer (doped or undoped) may be epitaxially grown on the exposed major surface 100a of the substrate 100 over the bottom surface 503 of each opening 81 to form the protrusions 511. Alternatively, the protrusions 511 may be formed by forming a bottom epitaxial single crystal semiconductor (e.g., silicon) layer over the bottom surface 507 of the front side opening 81, and then forming at least one layer of a second material, such as a second semiconductor material (e.g., a polycrystalline semiconductor material, such as polysilicon), a metal and/or a metal nitride, over the bottom epitaxial single crystal semiconductor layer within each of the openings 81. Alternatively, a polycrystalline semiconductor (e.g., silicon) layer (doped or undoped) may be formed over the bottom surface 507 of the front side opening 81 and may then be recrystallized by thermal treatment or by laser annealing to form a single crystal or large grain polycrystalline semiconductor material.

The front side openings 81 may then be etched (e.g., using a wet chemical etch) to remove the insulating layer 509 from the sidewall 505 of the opening 81 above the protrusion 511, as shown in FIG. 5D. The insulating layer 509 may remain adjacent to the protrusion 511.

The protrusions 511 may comprise semiconductor channel portions of a lower (e.g., source-side) select or access transistor of the completed NAND string 150. In the completed NAND string 150, the protrusion 511 may be connected at a first (e.g., top) end to the vertically-oriented semiconductor channel 1 of the NAND string 150 (see FIGS. 1A-2B, 3B and 4) and at a second (e.g., bottom) end to a horizontal channel portion 513 located on or within the substrate 100 and extending substantially parallel to the major surface 100a of the substrate 100. Each protrusion 511 may have a substantially pillar- or rail-shaped structure extending from the surface 100a of the substrate 100, and may be surrounded by the insulating layer 509. A conductive gate electrode layer may be subsequently formed adjacent to the insulating layer 509, and the insulating layer 509 may comprise a gate insulator located between the gate electrode and the protrusion 511 (i.e., semiconductor channel) of the lower (e.g., source side) select transistor. Examples of suitable configurations and methods for making the lower (e.g., source side) select transistors of a monolithic three dimensional array of vertical NAND strings 150 are described, for example, in U.S. patent application Ser. No. 14/133,979, filed on Dec. 19, 2013, U.S. patent application Ser. No. 14/225,116, filed on Mar. 25, 2014, U.S. patent application Ser. No. 14/225,176, filed on Mar. 25, 2014, and U.S. Provisional Patent Application No. 61/977,173, filed on Apr. 9, 2014, all of which are incorporated by reference herein for all purposes.

Referring to FIG. 5E, a first portion of the second material layers 121 is removed through the front side opening 81 to form front side recesses 515 between the first material layers 19. In embodiments, the second material layers 121 may comprise silicon nitride that is selectively etched relative to the material (e.g., silicon oxide) of the first material layers 19 to form the front side recesses 515. The layers 121 may be etched using a wet chemical etching process (e.g., using a hot phosphoric acid etch).

Optionally, portions of the first material layers 19 exposed in the front side recesses 515 may be removed to provide slimmed regions 517 of the first material layers 19, as shown in FIG. 5F. The slimmed regions 517 may have a thickness $t_1$ in a direction substantially perpendicular to the major surface 100a of the substrate 100 that is less than the thickness $t_2$ of the first material layers 19 not exposed in the front side recesses 515, as illustrated in FIG. 5F. The slimmed regions 517 may be formed in a separate step (e.g., using a different etching process) from the step of forming the front side recesses 515.

Referring to FIG. 5G, a first blocking dielectric 519 may be formed over the stack 120 and within the front side openings 81. The first blocking dielectric 519 may be formed within the front side recesses 515, including over the slimmed regions 517 on the sidewalls 505 of the front side openings 81, and over the protrusions 511 at the bottom surfaces 507 of the front side openings 81 as shown in FIG. 5G. The first blocking dielectric 519 may comprise a stack of two or more different insulating layers comprising different insulating materials. For example, the different insulating materials may include silicon oxide, silicon nitride, silicon oxynitride and/or a high-k material such as $Al_2O_3$, $HfO_2$, HfSiO, $TaO_2$ or other metal oxides. In one embodiment, the first blocking dielectric 519 may include a stack comprising at least one layer of silicon oxide and at least one layer of a metal oxide, such as aluminum oxide and/or hafnium oxide.

Referring to FIG. 5H, a charge storage material 521 may be formed over the first blocking dielectric 519 within the memory openings 81 and may be recessed by a directional dry etch process to provide a plurality of vertically spaced apart charge storage regions 9 located within the front side recesses 515. The first blocking dielectric 519 may surround the charge storage regions 9 on the top 523, bottom 525 and first side surfaces 527 of each of the charge storage regions 9. A second side surface 529 of the charge storage regions 9 may face the front side opening 81 and may define a portion of the sidewall 505 of the front side opening 81. An additional portion of the sidewall 505 may be defined by the first blocking dielectric 519. The charge storage regions 9 may comprise floating gates comprised of a semiconductor material, such as (doped or undoped) polysilicon or silicon germanium, or a metal or metal alloy (e.g., TiN or metal silicide). Alternatively, the charge storage regions 9 may comprise discrete regions of a dielectric charge storage material (e.g., silicon nitride).

Figure 5I:
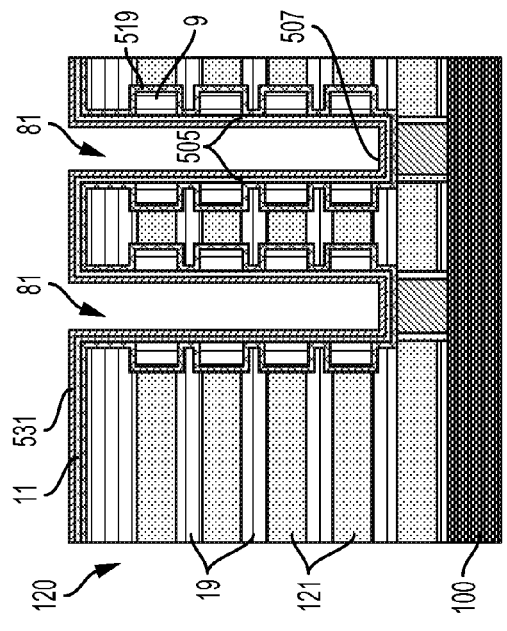
FIGS. 5A-5R illustrate a method of making a NAND string according to one embodiment.

Referring to FIG. 5I, a tunnel dielectric layer 11 (e.g., an oxide layer, such as a silicon oxide or silicon oxynitride layer) may be formed over the stack 120, including over the charge storage regions 9 and the blocking dielectric 519 on the sidewall 505 of each of the front side memory openings 81, and over the blocking dielectric 519 on the bottom surfaces 507 of the front side memory openings 81.

Figure 5J:
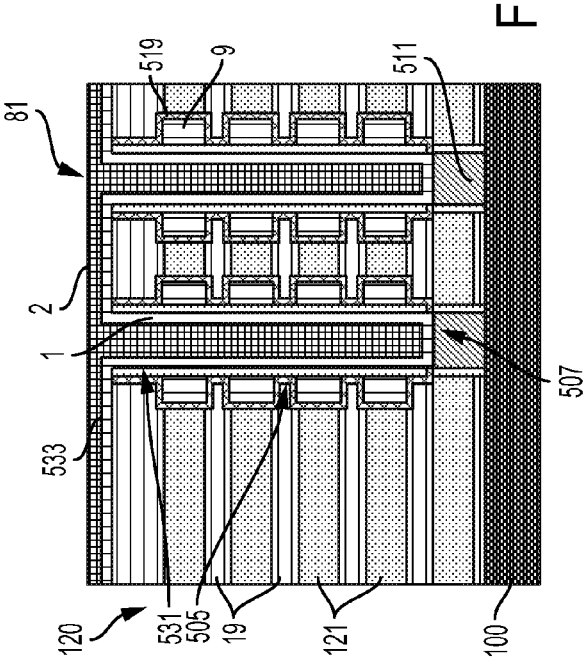

Referring to FIG. 5J, a semiconductor cover layer 531 (e.g., a polysilicon or amorphous silicon layer) may be formed over the stack 120, including over the tunnel dielectric layer 11 on the sidewall 505 and bottom surface 507 of each of the front side memory openings 81.

Figure 5K:
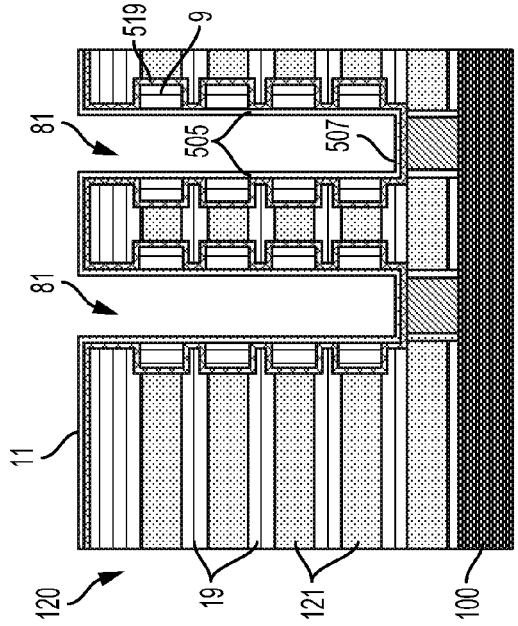

Referring to FIG. 5K, an anisotropic etching process (e.g., a reactive ion etch (RIE) process) may be used to remove the semiconductor cover layer 531, the tunnel dielectric layer 11 and the first blocking dielectric 519 from the top surface 510 of the stack 120 and from the bottom surfaces 507 of the front side memory openings 81 to expose the protrusions 511 (or substrate 100 if protrusions 511 are omitted) at the bottom surfaces 507 of the memory openings 81. The semiconductor cover layer 531 may protect the tunnel dielectric layer 11, the blocking dielectric 519 and the charge storage regions 9 on the sidewalls 505 of the front side memory openings 81 from etching damage.

Figure 5L:
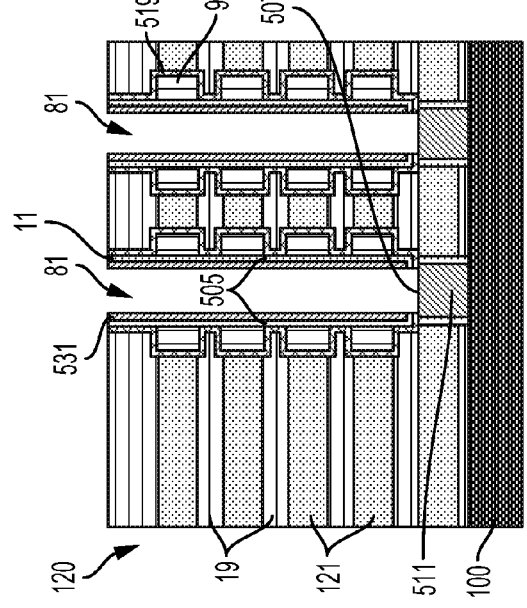

Referring to FIG. 5L, a semiconductor material channel layer 533 (e.g. a polysilicon or amorphous silicon layer) is formed over the stack 120 including over the semiconductor cover layer 531 along the sidewall 505 of each of the front side openings 81 and over the exposed protrusion 511 (or substrate 100 if protrusions 511 are omitted) on the bottom surface 507 of each of the front side openings 81. The semiconductor material channel layer 533 may contact the semiconductor cover layer 531 within each of the front side openings 81 and together the layers 533, 531 may form a vertically oriented semiconductor channel 1 as described above with reference to FIGS. 1A-2B and 3B. An insulating fill material 2 (e.g., an oxide, such as silicon oxide) may be formed over the stack 120 and fill the front side openings 81, as shown in FIG. 5L.

Referring to FIG. 5M, the insulating fill material 2 and the semiconductor material channel layer 533 may be removed from the top surface of the stack 120 (e.g., via etching and/or chemical mechanical polishing (CMP)) to expose the insulating material layer 19 at the top surface of the stack 120. Additional insulating material (e.g., silicon oxide from a TEOS source) may be added to the layer 19 at the top 510 of the stack 120, as shown in FIG. 5M.

Referring to FIG. 5N, at least one support column 535 may be formed extending substantially perpendicular to the major surface 100a of the substrate 100. The at least one support column 535 may be formed by etching through the layers 19, 121 of the stack 120 to form an opening and filling the opening with a suitable material, such as an insulating material (e.g., an oxide, such as silicon oxide). The at least one support column 535 may provide mechanical support for layers 19 during a control gate replacement step, as described below.

Referring to FIG. 5O, the stack 120 may be etched (e.g., through a mask patterned by photolithography, not shown in FIG. 5O) to form one or more back side openings (e.g., trenches) 84 in the stack 120. In this embodiment, the back side opening (e.g., trench) 84 extends through the entire stack 120 to the semiconductor substrate 100. The alternating layers 19, 121 of the stack 120 may at least partially define the sidewalls 534 of the back side opening 84, and the substrate 100 may define the bottom surface 536 of the back side opening 84. A source region 537 may be formed in the semiconductor substrate 100 through the back side opening 84 (e.g., via N+ ion implantation followed by an annealing step to form an n-type doped source region 537 at the bottom 536 of the back side opening 84). Alternatively or in addition, a metal (e.g., tungsten) silicide layer (not shown in FIG. 5O) may be formed over the bottom surface 536 of the back side opening 84 to reduce contact resistance.

Referring to FIG. 5P, at least a portion of the second material layers 121 may be removed through the back side opening 84 to form back side recesses 539 between the first material layers 19. Layers 121 may be removed by selective etching, such as a silicon nitride selective etching (e.g., a hot phosphoric acid wet etch) which removes silicon nitride layers 121 but does not remove the silicon oxide layers 19. The at least one support column 535 may support the silicon oxide layers 19 after the portions of the sacrificial second material layers 121 are removed. The selective etch may use the first blocking dielectric 519 as an etch stop such that first portions 541 of the first blocking dielectric 519 are exposed in the back side recesses 539.

Optionally, portions of the first material layers 19 exposed in the back side recesses 539 may be removed to provide slimmed regions of the first material layers 19 within the back side recesses 539. In other words, the first material layers 19 exposed in the back side openings may have an initial thickness $t_2$ (see FIG. 5F), and may be etched to decrease the thickness of the layers 19 and thereby also increase the thickness of the back side recesses 539 in a direction substantially perpendicular to the major surface 100a of the substrate 100. The slimming of the first material layers 19 may be performed in a separate step (e.g., using a different etching process) from the step of removing the sacrificial second material layers 121 to form the back side recesses 539.

Referring to FIG. 5Q, a second blocking dielectric 543 may be formed in the back side recesses 539 through the back side opening 84. In this embodiment, the first portions 541 of the first blocking dielectric 519 are retained in the back side recesses 539, and the step of forming the second blocking dielectric 543 includes forming the second blocking dielectric 543 in contact with the first portions 541 of the first blocking dielectric 519. Alternatively, as described further below, the first portions 541 of the first blocking dielectric 519 exposed in the back side recesses 539 may be removed prior to forming the second blocking dielectric 543. The second blocking dielectric 543 also is formed over the exposed surfaces of the first material layers 19 in the back side recesses 539, which may optionally be slimmed layers as described above.

The second blocking dielectric 543 may comprise the same material(s) or different material(s) from the first blocking dielectric 519. In embodiments, the second blocking dielectric 543 may comprise a stack of two or more different insulating layers comprising different insulating materials. For example, the different insulating materials may include silicon oxide, silicon nitride, silicon oxynitride and/or a high-k material such as $Al_2O_3$, $HfO_2$, HfSiO, $TaO_2$ or other metal oxides. In one embodiment, the second blocking dielectric 543 may include a stack comprising at least one layer of silicon oxide and at least one layer of a metal oxide, such as aluminum oxide and/or hafnium oxide. In embodiments, the second blocking dielectric 543 may include at least one of aluminum oxide and silicon oxynitride.

Referring again to FIG. 5Q, control gates 3 may be formed over the second blocking dielectric 543 in the back side recesses 539 through the back side opening 84. Each of the control gates 3 may include a top surface 545, a bottom surface 547 opposite the top surface 545, and a first side surface 549 facing the vertically-extending semiconductor channel 1 in the memory opening 81. The control gates 3 may be formed over the second blocking dielectric 543 such that the second blocking dielectric 543 surrounds each of the control gates 3 on the top 545, bottom 547 and first side surfaces 549 of the control gate 3.

Each of the control gates 3 may comprise one or more electrically conductive materials, such as a metal, metal nitride, metal silicide or heavily doped semiconductor material. In one embodiment, the control gates 3 are formed by depositing a metal nitride liner material 551 (e.g., tungsten nitride (WN) or titanium nitride (TiN) liner) over the second blocking dielectric 543 in the back side recesses 539, followed by depositing a metal material 553 (e.g., tungsten) over the metal nitride liner material 551 to fill the back side recesses 539. Optionally, a thin layer of a doped semiconductor material, such as doped polysilicon (not shown in FIG. 5Q) may be deposited over the second blocking dielectric 543 in the back side recesses 539, and the metal nitride liner material 551 and metal material 553 may be deposited over the doped semiconductor material. Any of the metal material 553, metal nitride liner material 551, optional doped semiconductor material and second blocking dielectric 543 located in the back side opening 84 may be removed from the back side opening 84 (e.g., via one or more etching steps) as shown in FIG. 5Q.

Referring to FIG. 5R, a layer of insulating material 555 (e.g., silicon oxide) may be formed over the sidewalls 534 of the back side opening 84 (i.e., slit trench) while the source region 537 at the bottom surface 536 of the back side opening 84 may be exposed. A source side electrode 102 (i.e., source line) comprising an electrically conductive material may be formed within the back side opening 84 and electrically contacting the source region 537 at the bottom surface 536 of the back side opening 84. The layer of insulating material 555 may electrically insulate the source side electrode 102 from the plurality of control gates 3 along the sidewalls 534 of the back side opening 84. The source side electrode 102 may comprise one or more electrically conductive materials, such as a metal, metal nitride, metal silicide or heavily doped semiconductor material. In one embodiment, the source side electrode 102 may be formed by depositing a metal nitride liner material 557 (e.g., WN or TiN liner) over the layer of insulating material 555 followed by depositing a metal material 559 (e.g., W) over the metal nitride liner material 557 to fill the back side opening 84.

Figure 6A:
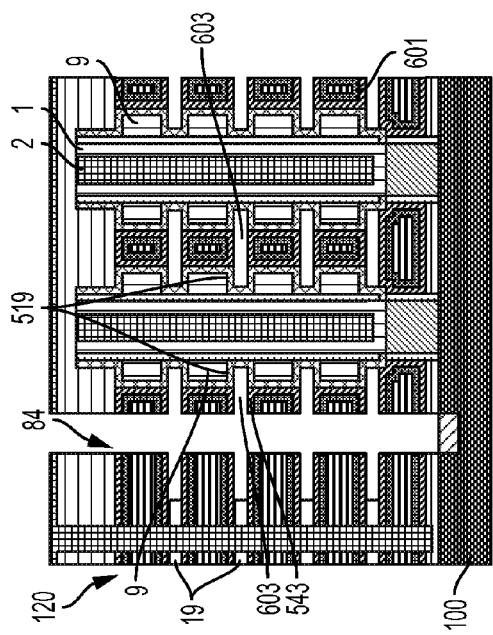
FIGS. 6A-6D illustrate a method of making a NAND string according to another embodiment.

A second embodiment method of making a NAND string 150 with air gaps formed through the back side opening is illustrated in FIGS. 6A-6D. FIG. 6A corresponds to FIG. 5Q, and shows the stack 120 after formation of the second blocking dielectric 543 in the back side recesses 539 through the back side opening 84, and the formation of the conductive control gates 3 over the second blocking dielectric 543 in the back side recesses 539 through the back side opening 84. FIG. 6A also shows a thin layer of doped semiconductor material 601 (e.g., doped polysilicon) that is formed over the second blocking dielectric 543 in the back side recesses 539, as described above.

Figure 6B:
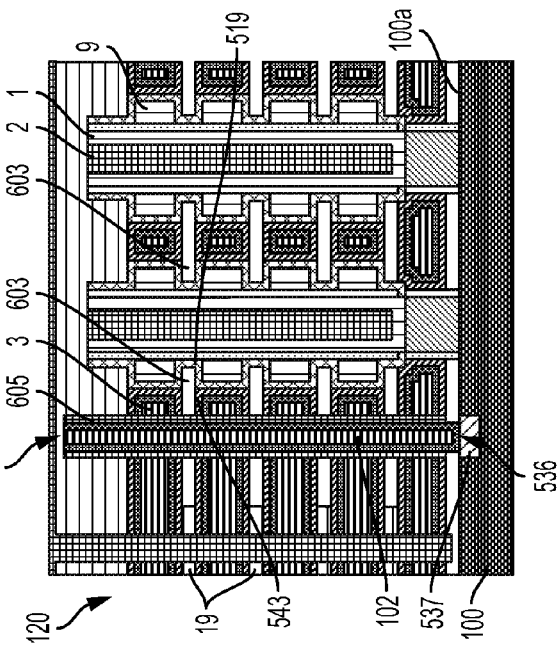

Referring to FIG. 6B, the first material layers 19 of the stack 120 may be etched through the back side opening 84 to remove at least a portion of the first material layers 19 to form air gaps 603 between the control gates 3. As shown in FIG. 6B, the etching of the first material layers 19 may use the first blocking dielectric 519 as an etch stop, and the air gaps 603 may extend between the vertically-spaced apart charge storage regions 9.

Figure 6C:
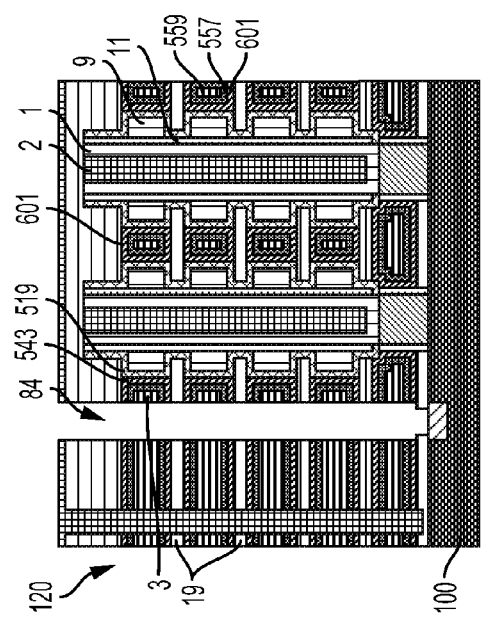

Referring to FIG. 6C, a layer of insulating material 605, such as silicon oxide, may be formed over the stack 120, including over the top 510 of the stack 120 and on the sidewalls 534 and bottom surface 536 of the back side opening 84 such that the insulating material 605 along the sidewalls 534 of the back side opening 84 separates the air gaps 603 from the back side opening 84. In one embodiment, the insulating material 605 may be deposited using a non-conformal deposition process such that the insulating material 605 preferentially forms on the exposed surfaces of the control gates 3 and the second blocking dielectric 543 on the sidewalls 534 of the back side opening 84 and closes the gaps between adjacent control gates 3 to separate the air gaps 603 from the back side opening 84.

Figure 6D:
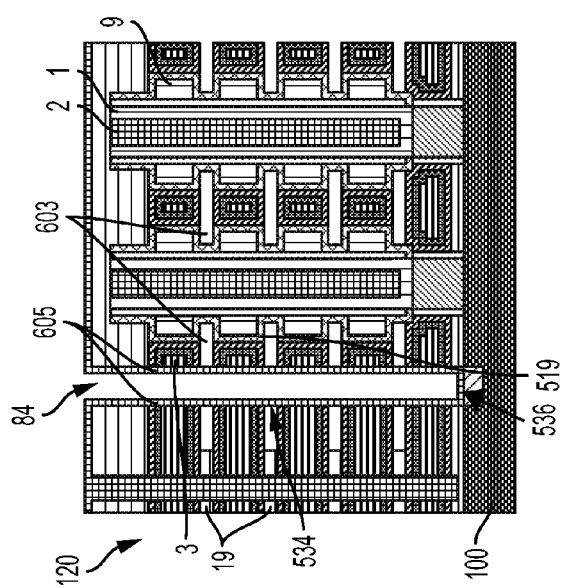

Next, the insulating material 605 may be removed from bottom surface 536 of the back side opening 84 (e.g., using a directional etching process) while the insulating material 605 remains on the sidewalls 534 of the back side opening 84, as shown in FIG. 6D. A source-side electrode 102 (e.g., source line) may be formed in the back side opening 84 and in electrical contact with the source region 537, as described above in connection with FIG. 5R.

As shown in FIG. 6D, the air gaps 603 may have a substantially rectangular-shaped cross section in a plane extending perpendicular to the major surface 100a of the substrate 100. Each air gap 603 may comprise a void region enclosed on at least three sides by the first and second blocking dielectrics 519, 543. A fourth side of the air gaps 603 may be enclosed by the layer of insulating material 605 extending over a sidewall 534 of the back side opening 84.

In some embodiments, the step of forming the second blocking dielectric 543 in the back side recesses 539 through the back side opening 84 may be omitted, and the layer of doped semiconductor (e.g., polysilicon) material 601 may be formed in the back side recesses 539 through the back side opening 84 and contacting the exposed first portions 541 of the first blocking dielectric 519 in each of the back side recesses 539. Then, the metal nitride liner material 551 and metal material 553 may be deposited over the doped semiconductor material 601 to form the control gate electrodes 3. In this embodiment, the first portion 541 of the first blocking dielectric 519 is located between the first side surface 527 of the charge storage region 9 and the first side surface 549 of the control gate 3, and the blocking dielectric does not extend over the top and bottom surfaces of the control gate electrodes 3.

Figure 7C:
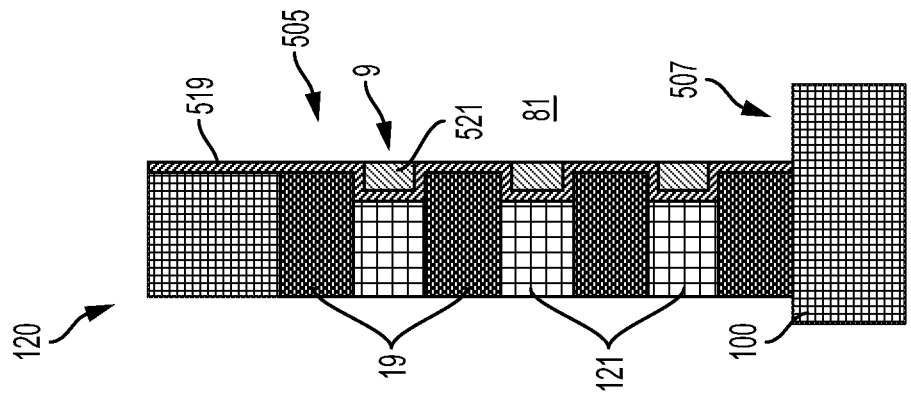
FIGS. 7A-7F illustrate a method of making a NAND string according to yet another embodiment.
Figure 7B:
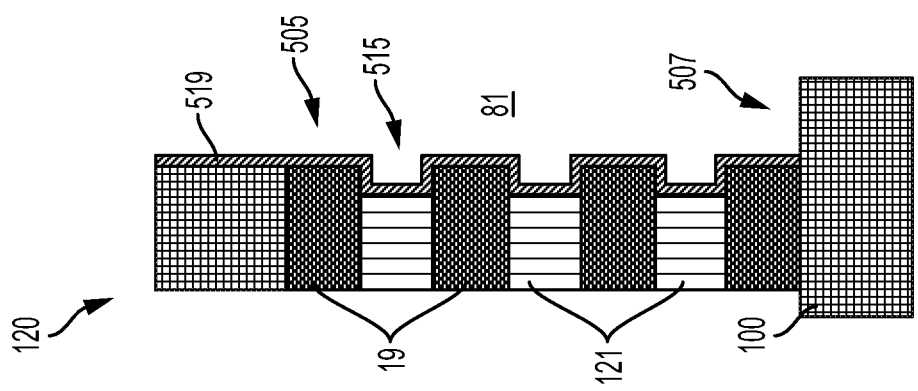
Figure 7A:
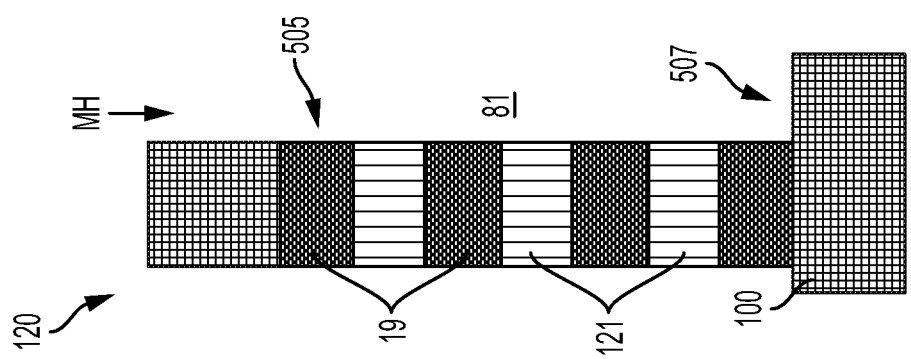

A third embodiment method of making a NAND string 150 is illustrated in FIGS. 7A-7F. FIG. 7A corresponds to the dashed region 504 of FIG. 5B, and illustrates a portion of the stack 120 of alternating layers of a first material 19 and a second material 121 over a substrate 100 and having a front side opening 81 formed through the stack 120. FIG. 7A illustrates a sidewall 505 and bottom surface 507 of the front side opening 81.

Referring to FIG. 7B, a first portion of the second material layers 121 is removed through the front side opening 81 to form front side recesses 515 between the first material layers 19, as described above in connection with FIG. 5E. (For clarity, the optional semiconductor protrusion 511 and gate insulating layer 509 shown in FIG. 5E are not illustrated in FIG. 7B). A first blocking dielectric 519 is formed in the front side recesses 515 through the front side opening 81, as described above in connection with FIG. 5G. In the embodiment of FIG. 7B, the first blocking dielectric 519 comprises a layer of silicon oxide which may be formed by atomic layer deposition (ALD).

Referring to FIG. 7C, a charge storage material 521 is formed over the first blocking dielectric 519 within the memory openings 81 and recessed (e.g., by a directional dry etch process) to provide a plurality of vertically spaced apart charge storage regions 9 located within the front side recesses 515.

Figure 7F:
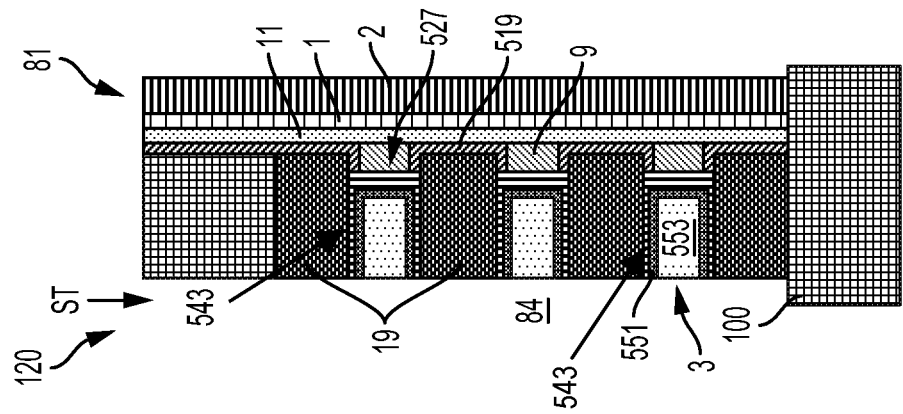
Figure 7E:
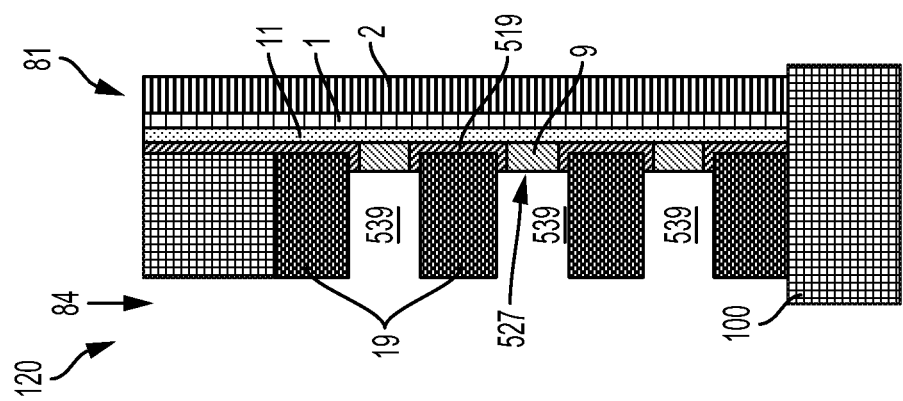
Figure 7D:
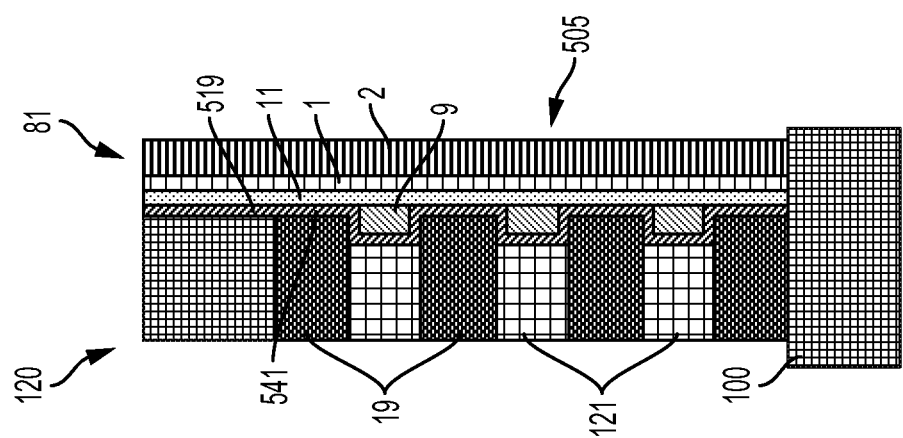

Referring to FIG. 7D, a tunnel dielectric layer 11 (e.g., oxide layer), a semiconductor (e.g., silicon) channel 1 and an insulating fill material 2 may be formed over the sidewall 505 of the front side opening 81, as described above in connection with FIGS. 5J-5L.

Referring to FIG. 7E, a back side opening 84 (e.g., slit trench) may be formed through the stack 120 and at least portions of the second material layers 121 may be etched through the back side opening 84 to form back side recesses 539 between the first material layers 19, as is described above in connection with FIGS. 5O and 5P. The first portions 541 of the first blocking dielectric 519 (see FIG. 7D) may be used as an etch stop such that the first portions 541 of the first blocking dielectric 519 are exposed in the back side recesses 539. The method of FIGS. 7A-7F is different from the method of FIGS. 5A-5R in that the first portions 541 of the first blocking dielectric 519 are then removed from the back side recesses 539 (e.g., using a separate etching step) to expose the first side surfaces 527 of the charge storage regions 9 in the back side recesses 539, as shown in FIG. 7E. Then, as shown in FIG. 7F, a second blocking dielectric 543 may be formed in the back side recesses 539, and may be formed directly contacting the first side surfaces 527 of the charge storage regions 9.

In this embodiment, the first blocking dielectric 519 and the second blocking dielectric 543 include different materials. The first blocking dielectric 519 may be silicon oxide and the second blocking dielectric 543 includes a stack of two or more different insulating layers comprising different insulating materials. The stack of two or more different insulating materials may include silicon oxide, silicon nitride, silicon oxynitride and/or a high-k material such as $Al_2O_3$, $HfO_2$, HfSiO, $TaO_2$ or other metal oxides. In one embodiment, the second blocking dielectric 543 includes a stack comprising at least one layer of silicon oxide and at least one layer of a metal oxide, such as aluminum oxide and/or hafnium oxide.

Alternatively, the first blocking dielectric 519 may comprise a stack of two or more insulating layers (e.g., silicon oxide, silicon nitride, silicon oxynitride and/or a high-k material such as $Al_2O_3$, $HfO_2$, HfSiO, $TaO_2$ or other metal oxides) that may be partially or completely removed from adjacent to the first side surfaces 527 of the charge storage regions 9 by etching through the back side recesses 539, followed by the deposition of the second blocking dielectric 543 comprising a stack of two or more insulating layers (e.g., silicon oxide, silicon nitride, silicon oxynitride and/or a high-k material such as $Al_2O_3$, $HfO_2$, HfSiO, $TaO_2$ or other metal oxides) over the back side recesses 539. The first and second blocking dielectrics 519, 543 may comprise identical stacks of insulating layers, or may be different stacks of insulating layers.

Referring to FIG. 7F, control gates 3 are formed over the second blocking dielectric 543 in the back side recesses 539. The control gates 3 may include a metal nitride liner 551 (e.g., WN, TiN) over the second blocking dielectric 543 and a metal material 553 (e.g., W) over the liner 551, as described above in connection with FIG. 5Q. Thus, as shown in FIG. 7F, each of the charge storage regions 9 may be surrounded on the top 523 and bottom 525 sides by the first blocking dielectric 519 and on the first side surface 527 by the second blocking dielectric 543, and each of the control gates 3 may be surrounded on the top surface 545, the bottom surface 547, and on the side surface 549 facing the charge storage region 9 by the second blocking dielectric 543.

Figure 8C:
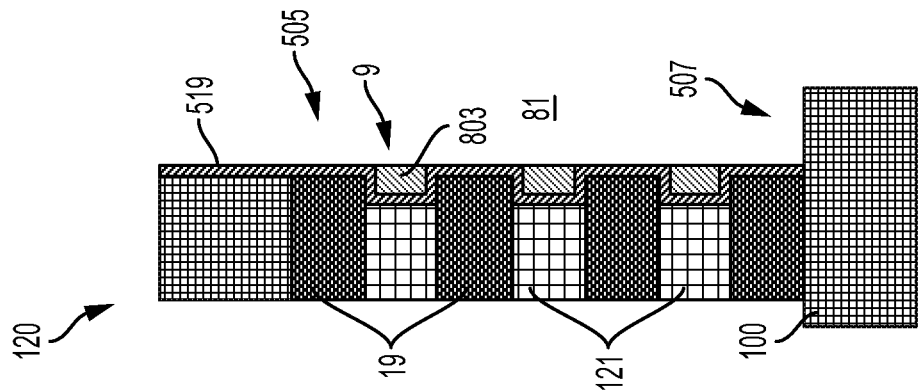
Figure 8B:
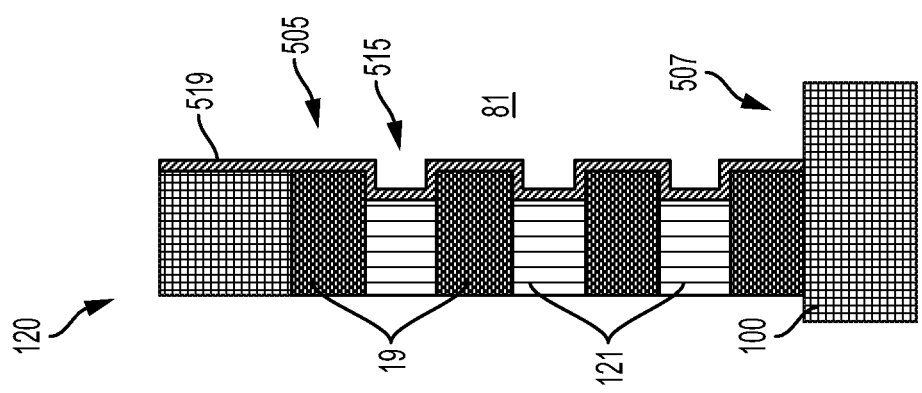
Figure 8A:
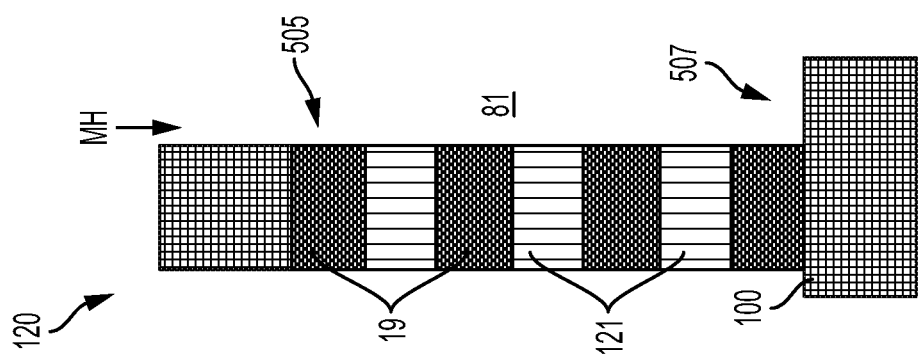

A fourth embodiment method of making a NAND string 150 with a hybrid charge storage region is illustrated in FIGS. 8A-8F. FIGS. 8A-8C are identical to FIGS. 7A-7C described above, and illustrate the removal of a first portion of the second material layers 121 through the front side opening 81 to form front side recesses 515, and the formation of a first blocking dielectric 519 (e.g., a silicon oxide layer deposited by ALD) in the front side recesses 515 (FIGS. 8A-8B), and the formation of a plurality of vertically spaced apart charge storage regions 9 over the first blocking dielectric 519 within the front side recesses 515 (FIG. 8C).

In this embodiment, the vertically spaced apart charge storage regions 9 are floating gates 803 which may comprise a semiconductor material (e.g., doped polysilicon or SiGe). Then, a dielectric charge trap layer 801 is formed over the sidewall 505 of the front side opening 81, including over the first blocking dielectric 519 and the plurality of vertically-spaced apart charge storage regions 9 (i.e., floating gates 803), as shown in FIG. 8D. The dielectric charge trap layer 801 may be a continuous layer extending over each of the vertically spaced apart floating gates 803 along the sidewall 505 of the front side opening 81. In embodiments, the dielectric charge trap layer 801 may comprise silicon nitride.

A tunnel dielectric layer 11 (e.g., oxide layer) may be formed over the dielectric charge trap layer 801 along the sidewall 505 of the front side opening 81, as shown in FIG. 8D. A semiconductor channel 1 may be formed over the tunnel dielectric layer 11 and an insulating fill material 2 may be formed over the semiconductor channel 1, as is also shown in FIG. 8D.

FIGS. 8E and 8F substantially correspond to FIGS. 7E and 7F described above. FIG. 8E illustrates the removal of the second material layers 121 through the back side opening 84 to form back side recesses 539, and optional the removal of the first potion 541 of the first blocking dielectric 519 to expose the first side surfaces 527 of the charge storage regions 9 (i.e., floating gates) in the back side recesses 539. FIG. 8F illustrates the formation of a second blocking dielectric 543 within the back side recesses 539 and optionally contacting the exposed first side surfaces 527 of the charge storage regions 9, and the formation of control gates 3 over the second blocking dielectric 543 within the back side recesses 539.

Figure 9G:
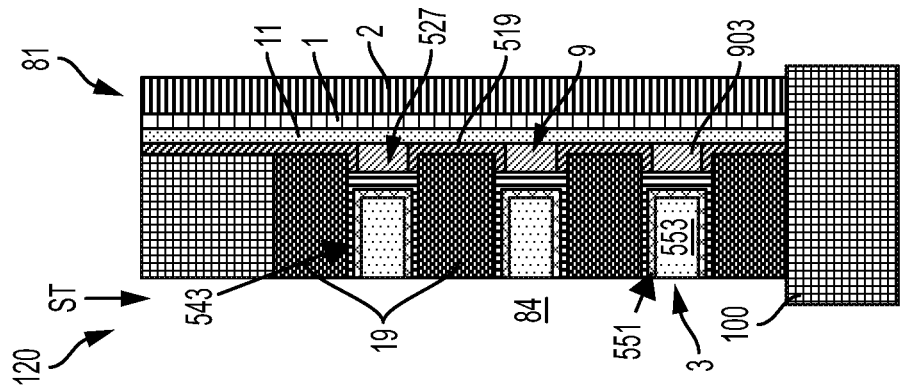

A fifth embodiment method of making a NAND string 150 containing silicide floating gates is illustrated in FIGS. 9A-9G. FIGS. 9A-9B correspond to FIGS. 7A-7C and 8A-8C described above, and illustrate the removal of a first portion of the second material layers 121 through the front side opening 81 to form front side recesses 515, and the formation of a first blocking dielectric 519 (e.g., a silicon oxide layer deposited by ALD) in the front side recesses 515, and the formation of a plurality of vertically spaced apart charge storage regions 9 over the first blocking dielectric 519 within the front side recesses 515.

In this embodiment, the vertically spaced apart charge storage regions 9 are silicon (e.g., polysilicon) floating gates. Then, a metal layer 901 is formed is formed over the sidewall 505 of the front side opening 81, including over the first blocking dielectric 519 and the plurality of vertically-spaced apart charge storage regions 9 (i.e., floating gates), as shown in FIG. 9C. The metal layer 901 may comprise a suitable metal material, such as Ni or Co. The silicon within the charge storage regions 9 and the metal of the metal layer 901 may then be reacted (such as by annealing) to form a metal silicide material 903 over at least a portion of the sidewall 505 of the front side opening 81 and within at least a portion of the front side recesses 515. The metal layer 901 may be a thin metal layer deposited by ALD such that the metal reacts with the silicon to form a metal silicide material 903. Any un-reacted metal 901 may then be removed (e.g., etched) from the sidewall 505 of the front side opening 81, leaving a plurality of discrete floating gates 9 comprising the metal silicide material 903 within the front side recesses 515, as shown in FIG. 9D.

Figure 9F:
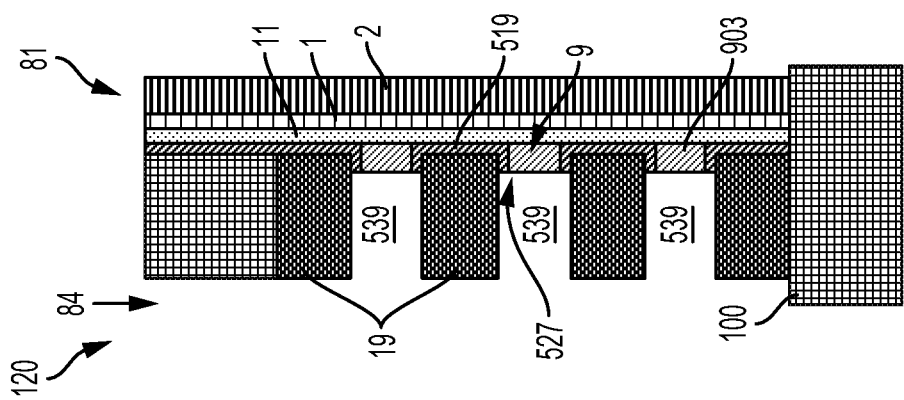
Figure 9E:
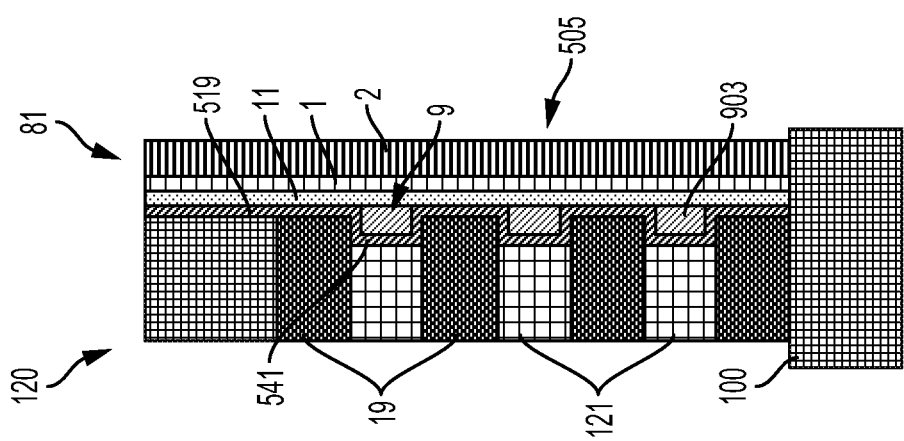

Referring to FIG. 9E, a tunnel dielectric layer 11 (e.g., oxide layer), a semiconductor (e.g., silicon) channel 1 and an insulating fill material 2 may be formed over the sidewall 505 of the front side opening 81, as described above in connection with FIGS. 5J-5L.

FIGS. 9F and 9G substantially correspond to FIGS. 7E-7F and FIGS. 8E-8F described above. FIG. 9F illustrates the removal of the second material layers 121 through the back side opening 84 to form back side recesses 539, and the removal of the first potion 541 of the first blocking dielectric 519 to expose the first side surfaces 527 of the charge storage regions 9 (i.e., metal silicide containing floating gates) in the back side recesses 539. FIG. 9G illustrates the formation of a second blocking dielectric 543 within the back side recesses 539 and contacting the exposed first side surfaces 527 of the charge storage regions 9, and the formation of control gates 3 over the second blocking dielectric 543 within the back side recesses 539. If desired, the silicide floating gates 903 may be used in combination with the silicon nitride layer 801 of the prior embodiment to form hybrid silicide-dielectric charge storage regions.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A monolithic three dimensional NAND string, comprising:
    a semiconductor channel, at least one end portion of the semiconductor channel extending substantially perpendicular to a major surface of a substrate;
    a plurality of control gate electrodes extending substantially parallel to the major surface of the substrate, wherein each control gate electrode comprises a top surface, a bottom surface opposite the top surface and a first side surface facing the at least one end portion of the semiconductor channel, and the plurality of control gate electrodes comprise at least a first control gate electrode located in a first device level and a second control gate electrode located in a second device level located over the major surface of the substrate and below the first device level;
    a plurality of vertically spaced apart charge storage regions, wherein each charge storage region comprises a top surface, a bottom surface opposite the top surface, a first side surface facing a control gate electrode and a second side surface facing the at least one end portion of the semiconductor channel, and the plurality of vertically spaced apart charge storage regions comprise at least a first spaced apart charge storage region located in the first device level and a second spaced apart charge storage region located in the second device level;
    a blocking dielectric surrounding each of the charge storage regions over the top, bottom and first side surfaces of the charge storage regions and surrounding each of the control gate electrodes over the top, bottom and first side surfaces of the control gate electrodes;
    a tunnel dielectric located between each one of the plurality of the vertically spaced apart charge storage regions and the semiconductor channel; and
    a plurality of air gaps between the respective device levels;
    wherein each of the plurality of air gaps has a substantially rectangular-shaped cross-section in a plane extending perpendicular to a major surface of the substrate, and each air gap comprises a void region enclosed on three sides by the blocking dielectric; and
    wherein each air gap comprises a void region enclosed on a fourth side by an insulating material that is not integrally formed with the blocking dielectric and extending over a sidewall of a trench extending in a direction that is substantially perpendicular to the major surface of the substrate.

2. The monolithic three dimensional NAND string of claim 1, wherein the blocking dielectric comprises a first blocking dielectric that extends over at least the top and bottom surfaces of the charge storage regions and a second blocking dielectric different than the first blocking dielectric that extends over the top, bottom and first side surfaces of the control gate electrodes.

3. The monolithic three dimensional NAND string of claim 2, wherein the first blocking dielectric does not extend over the first side surfaces of the charge storage regions, and the second blocking dielectric directly contacts the first side surfaces of the charge storage regions.

4. The monolithic three dimensional NAND string of claim 2, wherein the first blocking dielectric extends over the first side surfaces of the charge storage regions.

* * * * *